US006228668B1

United States Patent
Silverbrook

(10) Patent No.: US 6,228,668 B1
(45) Date of Patent: May 8, 2001

(54) METHOD OF MANUFACTURE OF A THERMALLY ACTUATED INK JET PRINTER HAVING A SERIES OF THERMAL ACTUATOR UNITS

(75) Inventor: Kia Silverbrook, Sydney (AU)

(73) Assignee: Silverbrook Research Pty LTD, Balmain NSW (AU)

( * ) Notice: Subject to any disclaimer, the term of this patent is extended or adjusted under 35 U.S.C. 154(b) by 0 days.

(21) Appl. No.: 09/112,833

(22) Filed: Jul. 10, 1998

(30) Foreign Application Priority Data

Jul. 15, 1997 (AU) .................................................. P07991
Jun. 8, 1998 (AU) .................................................. PP3989

(51) Int. Cl.⁷ .................................................. H01L 21/00
(52) U.S. Cl. .............................. 438/21; 347/20; 347/47; 347/56
(58) Field of Search .................................. 438/21; 347/1, 347/9, 20, 29, 32, 68, 44, 47, 54, 55, 56, 27; 251/129.01; 216/27

(56) References Cited

U.S. PATENT DOCUMENTS 5,889,541 * 3/1999 Bobrow et al. .......................... 347/55
5,897,789 * 4/1999 Weber .................................... 216/27

* cited by examiner

Primary Examiner—John F. Niebling
Assistant Examiner—Christopher Lattin

(57) ABSTRACT

A method of manufacture of an ink jet print head arrangement including a series of nozzle chambers is disclosed, the method comprising the steps of: (a) utilizing an initial semiconductor wafer having an electrical circuitry layer formed thereon; (b) etching the electrical circuitry layer so as to define a nozzle chamber area; (c) depositing and etching a first sacrificial layer, the etching defining a series of nozzle chamber walls and an actuator anchor point; (d) depositing a first heater material layer; (e) depositing an intermediate material layer; (f) etching the first heater material layer and the intermediate material layer to define portions of actuator, ejection paddle and nozzle chamber walls; (g) depositing and etching a second sacrificial layer, the etching including etching a cavity defining a portion of the nozzle chamber walls; (h) depositing and etching a further glass layer to define the roof of the nozzle chamber and the walls thereof; (i) etching an ink supply channel through the wafer to form a fluid communication with the nozzle chamber; (j) etching away remaining sacrifical material.

15 Claims, 7 Drawing Sheets

1

METHOD OF MANUFACTURE OF A THERMALLY ACTUATED INK JET PRINTER HAVING A SERIES OF THERMAL ACTUATOR UNITS

CROSS REFERENCES TO RElATED APPLICATIONS

The following co-pending US patent applications, identified by their U.S. patent application Serial Numbers (U.S.S.N.), were filed simultaneously to the present application on Jul. 10, 1998, and are hereby incorporated by cross-reference.
09/113,060; 09/113,070; 09/113,073; 09/112,748; 09/112,747; 09/112,776; 09/112,750; 09/112,746; 09/112,743; 09/112,742; 09/112,741; 09/112,740; 09/112,739; 09/113,053; 09/112,738; 09/113,067; 09/113,063; 09/113,069; 09/112,744; 09/113,058; 09/112,777; 09/113,224; 09/112,804; 09/112,805; 09/112,072; 09/112,785; 09/112,797; 09/112,796; 09/113,071; 09/112,824; 09/113,090; 09/112,823; 09/113,222; 09/112,786; 09/113,051; 09/112,782; 09/113,056; 09/113,059; 09/113,091; 09/112,753; 09/113,055; 09/113,057; 09/113,054; 09/112,752; 09/112,759; 09/112,757; 09/112,758; 09/113,107; 09/112,829; 09/112,792; 09/112,791; 09/112,790; 09/112,789; 09/112,788; 09/112,795; 09/112,749; 09/112,784; 09/112,783; 09/112,763; 09/112,762; 09/112,737; 09/112,761; 09/113,223; 09/112,781; 09/113,052; 09/112,834; 09/113,103; 09/113,101; 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821; 09/112,822; 09/112,825; 09/112,826; 09/112,827; 09/112,828; 09/113,111; 09/113,108; 09/113,109; 09/113,123; 09/113,114; 09/113,115; 09/113,129; 09/113,124; 09/113,125; 09/113,126; 09/113,119; 09/113,120; 09/113,221; 09/113,116; 09/113,118; 09/113,117; 09/113,113; 09/113,130; 09/113,110; 09/113,112; 09/113,087; 09/113,074; 09/113,089; 09/113,088; 09/112,771; 09/112,769; 09/112,770; 09/112,817; 09/113,076; 09/112,798; 09/112,801; 09/112,800; 09/112,799; 09/113,098; 09/112,833; 09/112,832; 09/112,831; 09/112,830; 09/112,836; 09/112,835; 09/113,102; 09/113,106; 09/113,105; 09/113,104; 09/112,810; 091112,766; 09/113,085; 09/113,086; 09/113,094; 09/112,760; 09/112,773; 09/112,774; 09/112,775; 09/112,745; 09/113,092; 09/113,100; 09/113,093; 09/113,062; 09/113,064; 09/113,082; 09/113,081; 09/113,080; 09/113,079; 09/113,065; 09/113,078; 09/113,075;

STATEMENT REGARDING FEDERALLY SPONSORED RESEARCH OR DEVELOPMENT

Not applicable.

FIELD OF THE INVENTION

The present invention relates to the field of inkjet printers and discloses an inkjet printing system which includes a bend actuator interconnected into a paddle for the ejection of ink through an ink ejection nozzle. In particular, the present invention discloses a method of Manufacture of a thermally actuated ink jet printer having a series of thermal actuator units.

BACKGROUND OF THE INVENTION

Many ink jet printing mechanisms are known. Unfortunately, in mass production techniques, the production of ink jet heads is quite difficult For example, often, the orifice or nozzle plate is constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, this limits the amount of mass production throughput given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

It is an object of the present invention to provide for a method of manufacture of an ink ejection nozzle arrangement suitable for incorporation into an inkjet printhead arrangement for the ejection of ink on demand from a nozzle chamber in an efficient manner. In particular the ink jet printer can comprise a thermally actuated ink jet printer having a series of thermal actuator units.

In accordance with a first aspect of the present invention, there is provided a method of manufacture of a thermally actuated ink jet printer having a series of thermal actuator units wherein an array of nozzles are formed on a substrate utilising planar monolithic deposition, lithographic and etching processes.

Multiple ink jet heads are preferably formed simultaneously on a single planar substrate. The substrate can be a silicon wafer. The print heads are preferably formed utilising standard vlsi/ulsi processing. Integrated drive electronics are preferably formed on the same substrate. The integrated drive electronics can be formed utilising a CMOS fabrication process.

Ink can be ejected from the substrate substantially normal to the substrate.

In accordance with a further aspect of the present invention, there is provided a method of manufacture of an ink jet print head arrangement including a series of nozzle chambers, the method comprising the steps of: (a) utilizing an initial semiconductor wafer having an electrical circuitry layer formed thereon; (b) etching the electrical circuitry layer so as to define a nozzle chamber area; (c) depositing and etching a first sacrificial layer, the etching defining a series of nozzle chamber walls and an actuator anchor point; (d) depositing a first heater material layer; (e) depositing an intermediate material layer; (f) etching the first heater material layer and the intermediate material layer to define portions of an actuator, ejection paddle and nozzle chamber walls; (g) depositing and etching a second sacrificial layer, the etching including etching a cavity defining a portion of the nozzle chamber walls; (h) depositing and etching a further glass layer to define the roof of the nozzle chamber and the walls thereof; (i) etching an ink supply channel through the wafer to form a fluid communication with the nozzle chamber; (j) etching away remaining sacrificial material.

The intermediate layer can comprise substantially glass. The first heater material layer can comprise substantially Titanium Nitride.

The steps further can include the step of etching anti-wicking notches in the surface of the circuitry layer.

Further, there is preferably included the step of depositing corrosion barriers over portions of the arrangement so as to reduce corrosion effects and the etching of layers preferably can includes etching vias so as to allow for the electrical interconnection of portions of subsequent layers. The wafer can comprise a double side polished CMOS wafer.

The step (j) can comprise a through wafer etch from a back surface of the wafer. The steps aforementioned are preferably also utilized to simultaneously separate the wafer into separate printheads.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

In the preferred embodiment, there is provided a nozzle chamber having ink within it and a thermal actuator device interconnected to a paddle the thermal actuator device being actuated so as to eject ink from the nozzle chamber. The preferred embodiment includes a particular thermal actuator structure which includes a series of tapered actuator heater arms for providing conductive heating of a conductive trace. The actuator arm is interconnected to a paddle by a slotted wall in the nozzle chamber. The actuator arm has a mating shape so as to mate substantially with the surfaces of the slot in the nozzle chamber wall.

Figure 1:
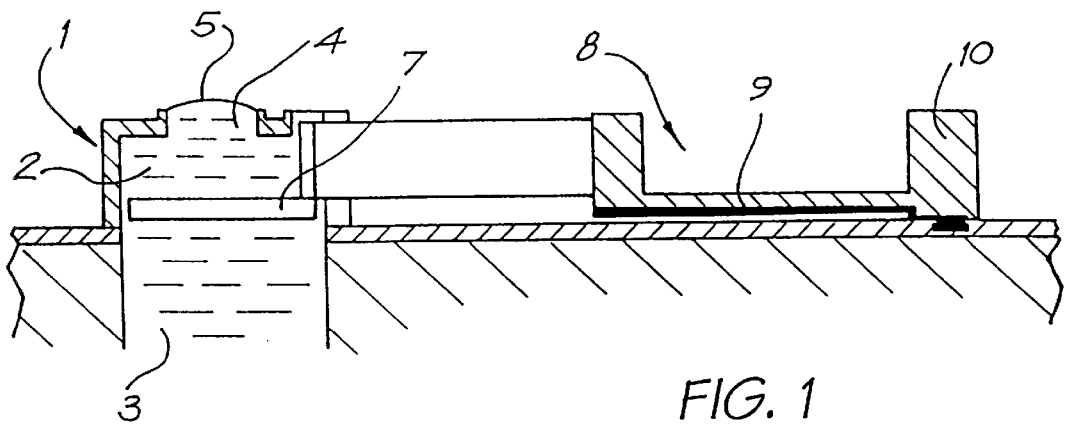
FIGS. 1–3 illustrate the basic operational principles of the preferred embodiment.
Figure 2:
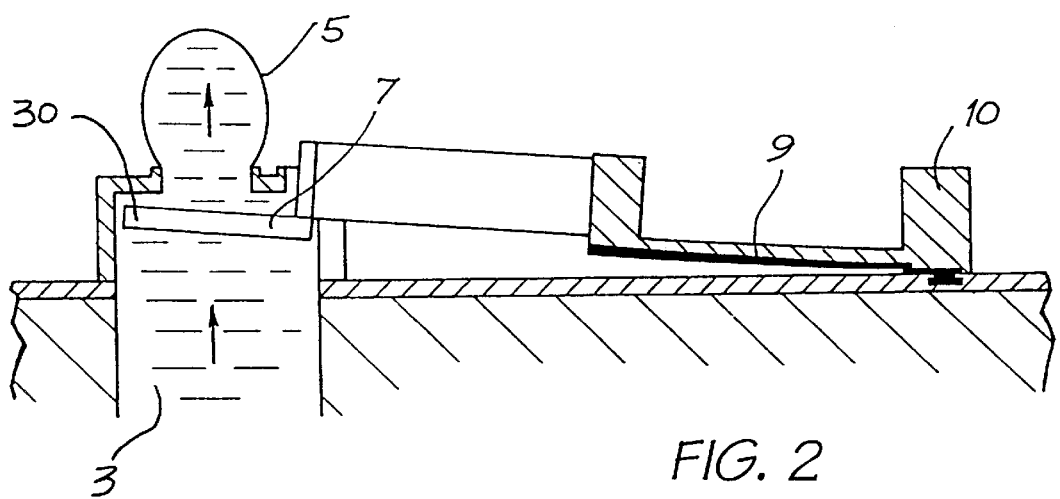
Figure 3:
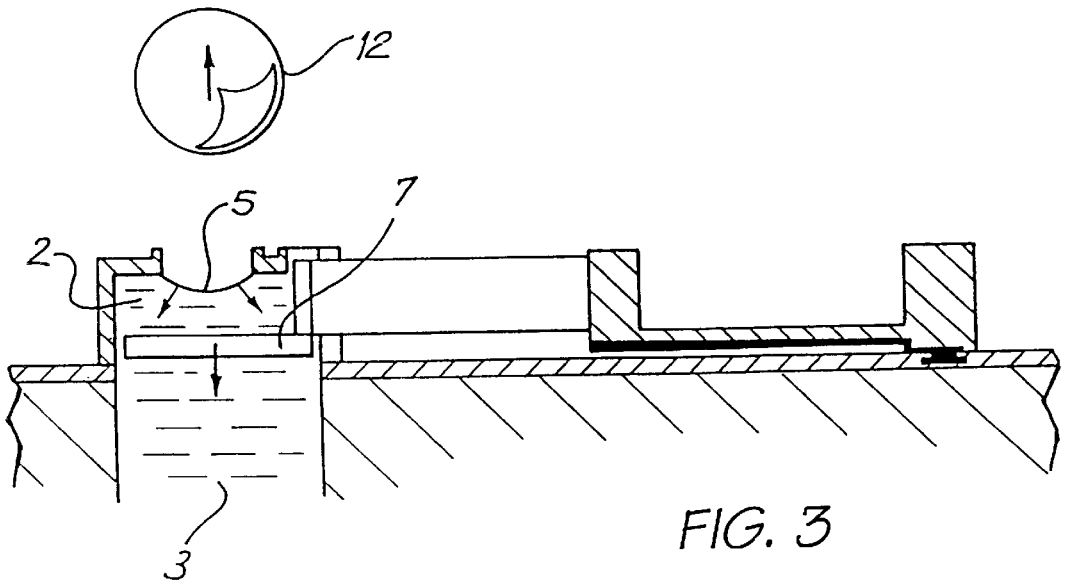

Turning initially to FIGS. 1–3, there is provided schematic illustrations of the basic operation of the device. A nozzle chamber 1 is provided filled with ink 2 by means of an ink inlet channel 3 which can be etched through a wafer substrate on which the nozzle chamber 1 rests. The nozzle chamber 1 further includes an ink ejection aperture 4 around which an ink meniscus 5 forms.

Inside the nozzle chamber 1 is a paddle type device 7 which is interconnected to an actuator arm 8 through a slot 22 (see FIG. 4) in the wall of the nozzle chamber 1. The actuator arm 8 includes a heater means e.g. 9 located adjacent to a post end portion 10 of the actuator arm, the post 10 being fixed to a substrate.

When it is desired to eject a drop from the nozzle chamber, as illustrated in FIG. 2, the heater means 9 is heated so as to undergo thermal expansion. Preferably, the heater means itself or the other portions of the actuator arm 8 are built from materials having a high bend efficiency where the bend efficiency is defined as $$\text{bend efficiency} = \frac{\text{Young's Modulus} \times \text{(Coefficient of thermal Expansion)}}{\text{Density} \times \text{Specific Heat Capacity}}$$

A suitable material for the heater elements is a copper nickel alloy which can be formed so as to bend a glass material.

The heater means is ideally located adjacent the post end portion 10 such that the effects of activation are magnified at the paddle end 30 such that small thermal expansions near post 10 result in large movements of the paddle end.

The heating 9 and consequential paddle movement causes a general increase in pressure around the ink meniscus 5 which expands, as illustrated in FIG. 2, in a rapid manner. The heater current is pulsed and ink is ejected out of the nozzle 4 in addition to flowing in from the ink channel 3.

Subsequently, the paddle 7 is deactivated to again return to its quiescent position. The deactivation causes a general reflow of the ink into the nozzle chamber. The forward momentum of the ink outside the nozzle rim and the corresponding backflow results in a general necking and breaking off of the drop 12 which proceeds to the print media. The collapsed meniscus 5 results in a general sucking of ink into the nozzle chamber 2 via the in flow channel 3. In time, the nozzle chamber is refilled such that the position in FIG. 1 is again reached and the nozzle chamber is subsequently ready for the ejection of another drop of ink.

Figure 4:
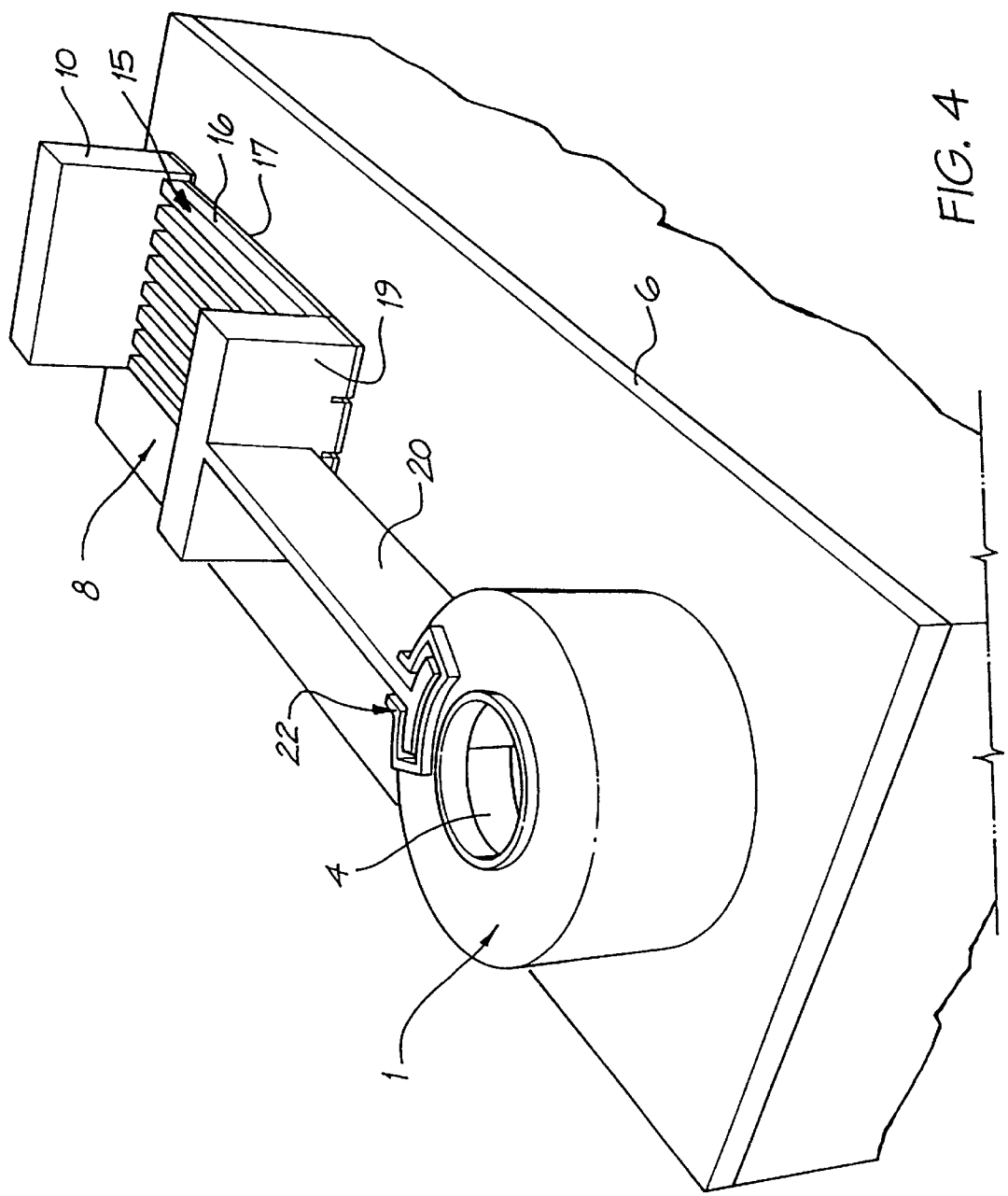
FIG. 4 is a side perspective view of a single inkjet nozzle arrangement constructed in accordance with the preferred embodiment.

Turning now to FIG. 4 there is illustrated a view of a single nozzle arrangements of the preferred embodiment. The arrangement of FIG. 4 has a number of structures which aid and assist in the low energy operation of the paddle.

Firstly, the actuator 8 includes a series of tapered heater sections 15 each of which comprises an upper glass portion (amorphous silicon dioxide) 16 formed on top of a titanium nitride layer 17. Alternatively a copper nickel alloy layer (hereinafter called cupronickel) can be utilized which will have a higher bend efficiency where bend efficiency is defined as:

$$\text{bend efficiency} = \frac{\text{Young's Modulus} \times \text{(Coefficient of thermal Expansion)}}{\text{Density} \times \text{Specific Heat Capacity}}$$

The titanium nitride layer 17 is in a tapered form and, as such, resistive heating takes place near the post end portion 10. Adjacent titanium nitride/glass portions are interconnected at block portion 19 which also provides for a mechanical structural support for the actuator arm.

The heater sections 15 ideally are tapered and are elongated and spaced apart such that, upon heating, the bending force exhibited along the axis of the actuator arm is maximized. The slots between adjacent tapered portions allow for slight differential operation of each thermal actuator with respect to adjacent actuators.

The block portion 19 is interconnected to an arm portion 20. The arm 20 is in turn connected to the paddle 7 inside the nozzle chamber 1 by means of a slot e.g. 22 formed in the side of the nozzle chamber 1. The formation of the slot 22 is designed generally to mate with the surfaces of the arm 20 so as to minimise opportunities for the outflow of ink around this arm. The ink is held generally within the nozzle chamber 1 via surface tension effects around the slot 22.

When it is desired to actuate the arm 8, a conductive current is passed through the titanium nitride layer 17 via vias within the block portion 10 connecting to a lower CMOS layer 6 which provides for the necessary power and control circuitry for the nozzle arrangement. The conductive current results in heating of the nitride layer 17 adjacent to the post portion 10 which results in a general upward bending of the arm 8 and the consequential ejection of ink out of the nozzle 4. The ejected drop is printed on page in the usual manner for an inkjet printer as previously described.

Figure 5:
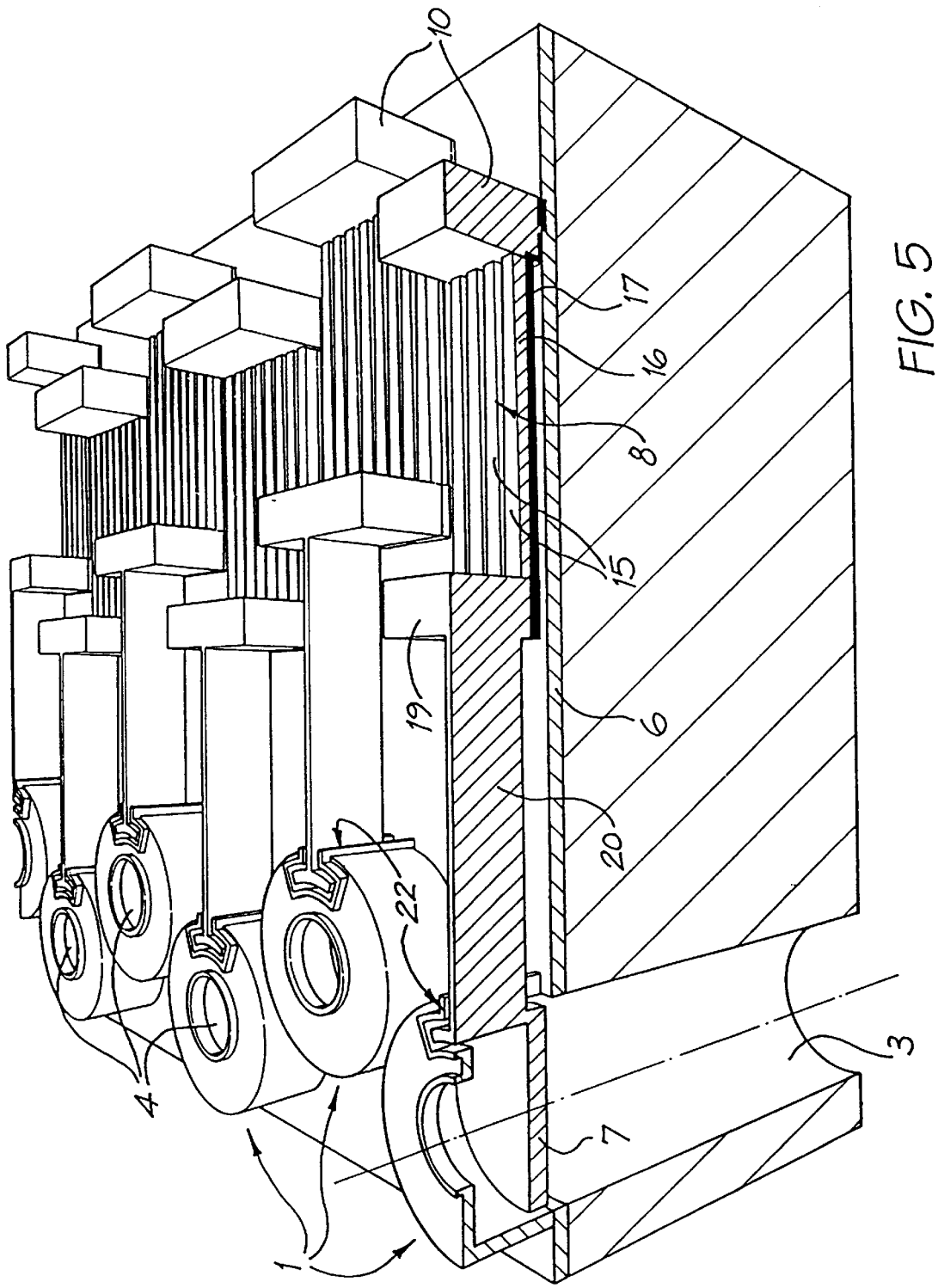
FIG. 5 is a side perspective view of a portion of an array of a printhead constructed in accordance with the principles of the preferred embodiment.

Obviously, an array of ink ejection devices can be subsequently formed so as to create a single printhead. For example, in FIG. 5 there is illustrated an array which comprises multiple ink ejection nozzle arrangements 1 laid out in interleaved lines so as to form a printhead array. Of course, different types of arrays can be formulated including full color arrays etc.

The preferred embodiment achieves a particular balance between utilisation of the standard semi-conductor processing material such as titanium nitride and glass in a MEMS process. Obviously the skilled person may make other choices of materials and design features where the economics are justified. For example, a copper nickel alloy of 50% copper and 50% nickel may be more advantageously deployed as the conductive heating compound as it is likely to have higher levels of bend efficiency. Also, other design structures may be employed where it is not necessary to provide for such a simple form of manufacture.

Figure 6:
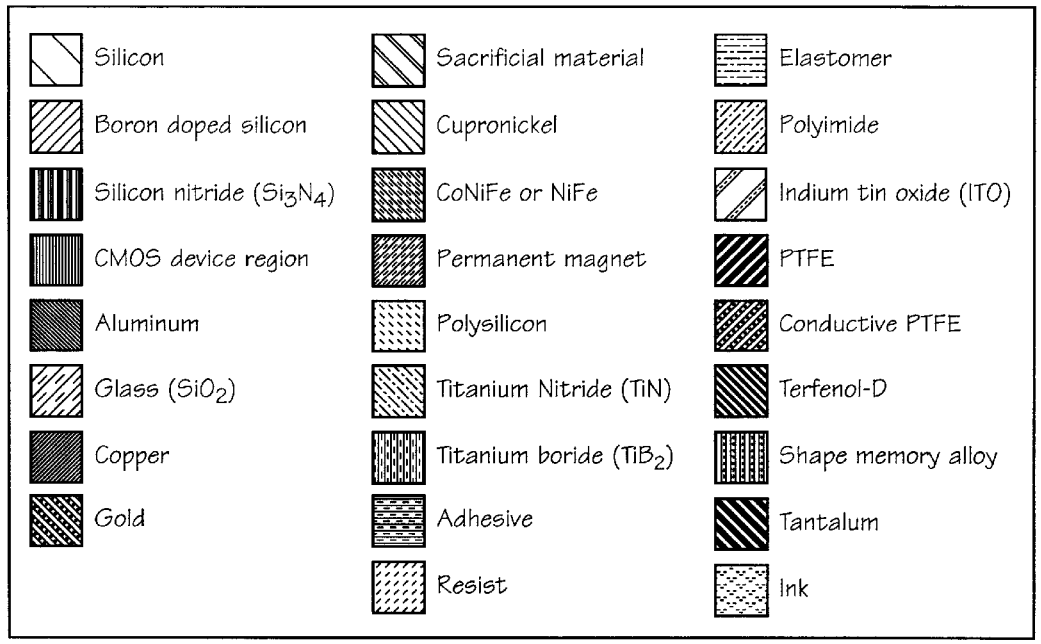
FIG. 6 provides a legend of the materials indicated in FIG. 7 to 16.
Figure 7:
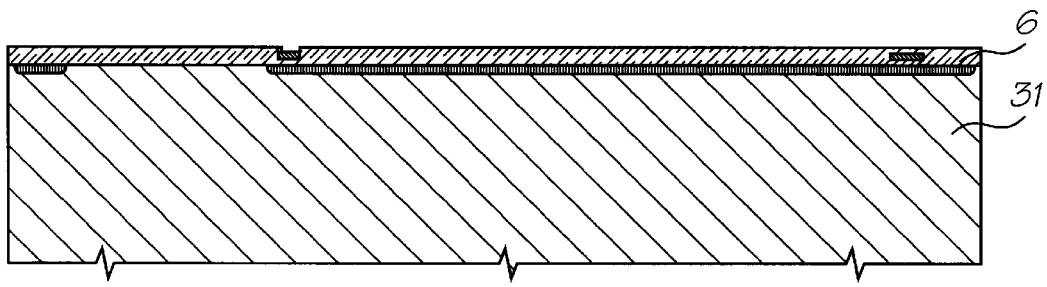
FIG. 7 to FIG. 16 illustrate sectional views of the manufacturing steps in one form of construction of an ink jet printhead nozzle.
Figure 8:
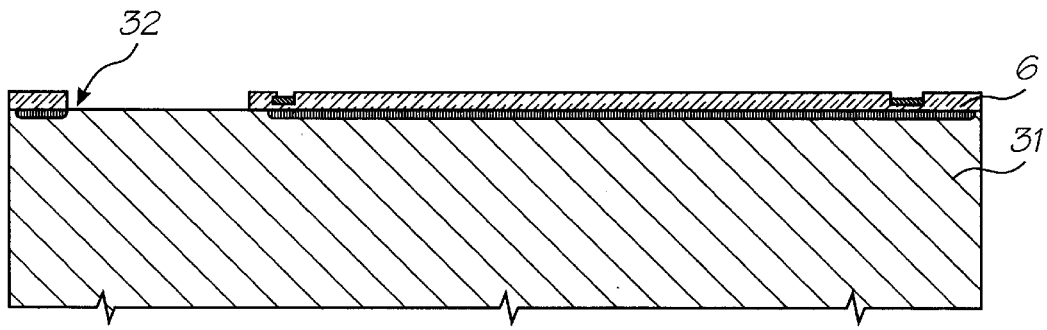
Figure 9:
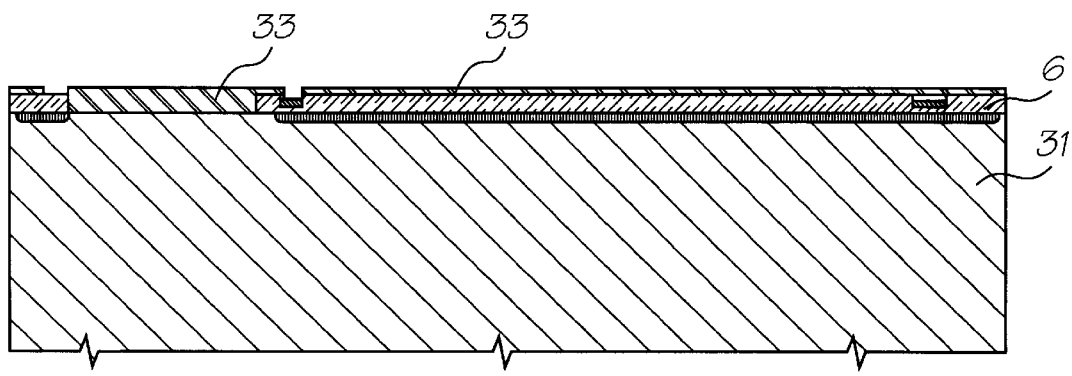
Figure 10:
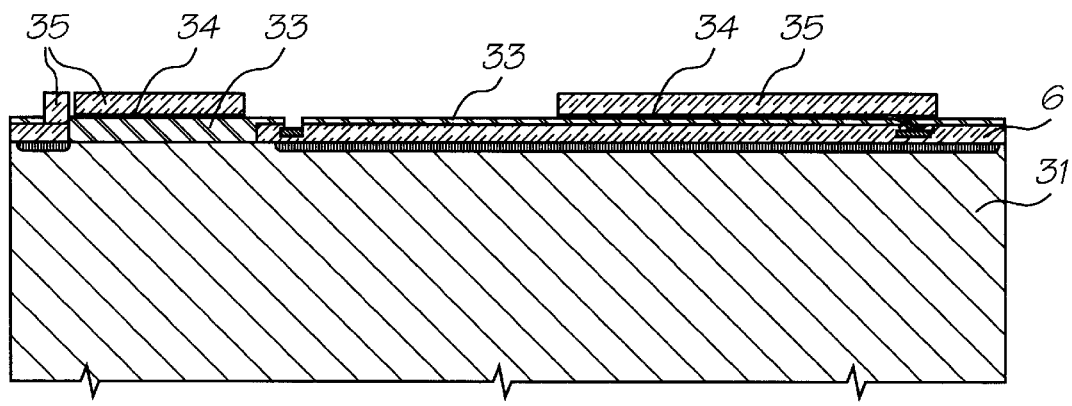
Figure 11:
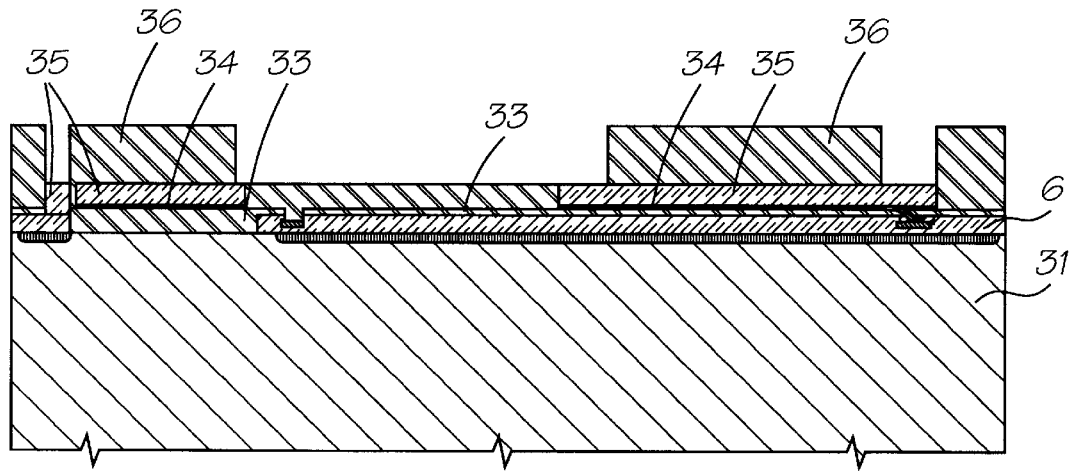
Figure 12:
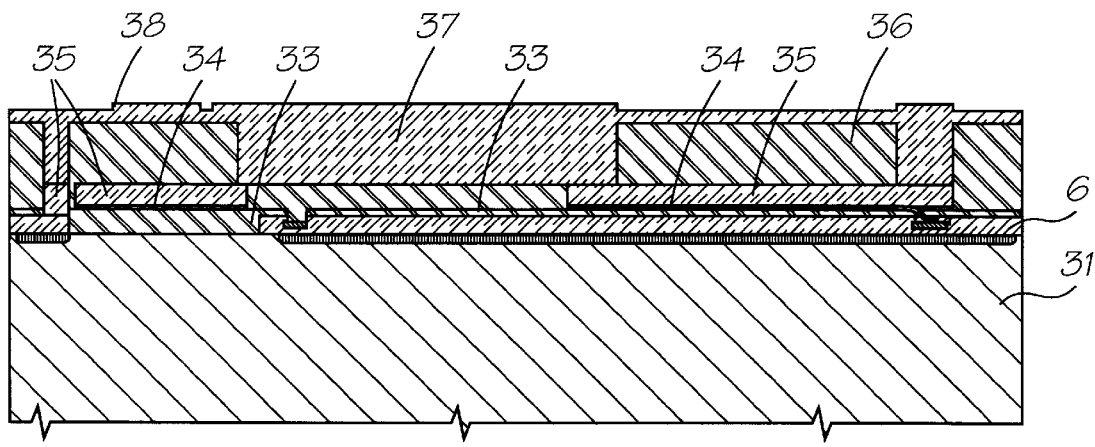
Figure 13:
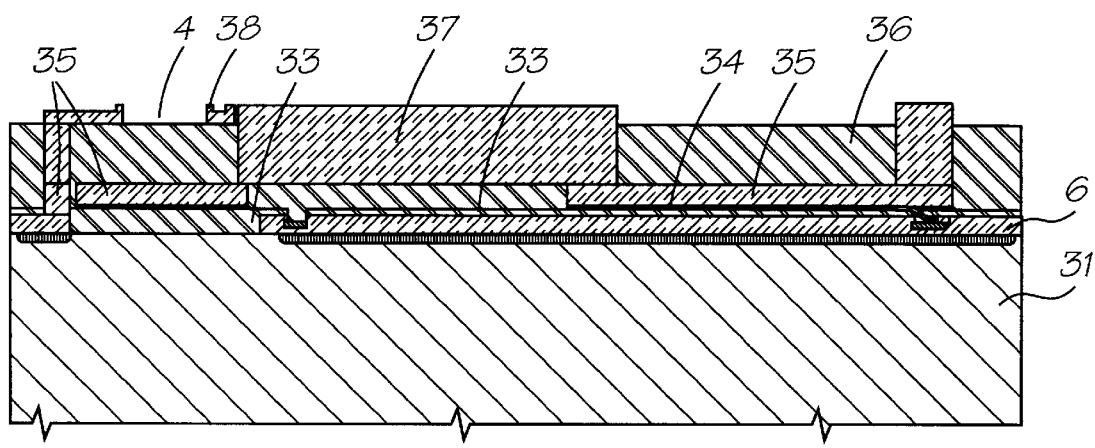
Figure 14:
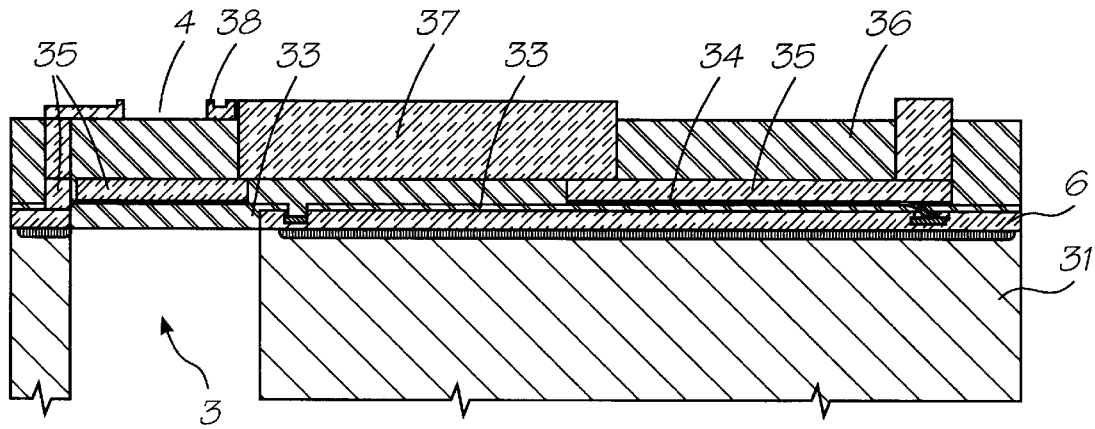
Figure 15:
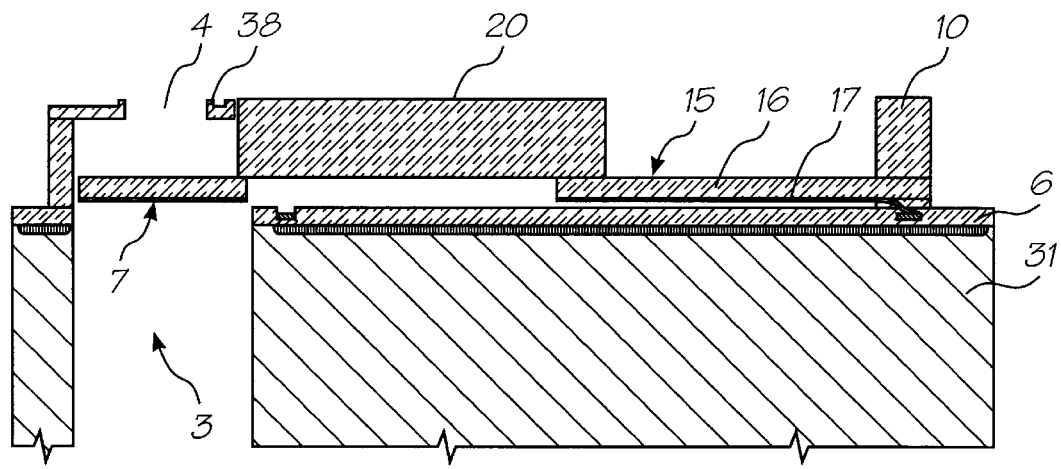
Figure 16:
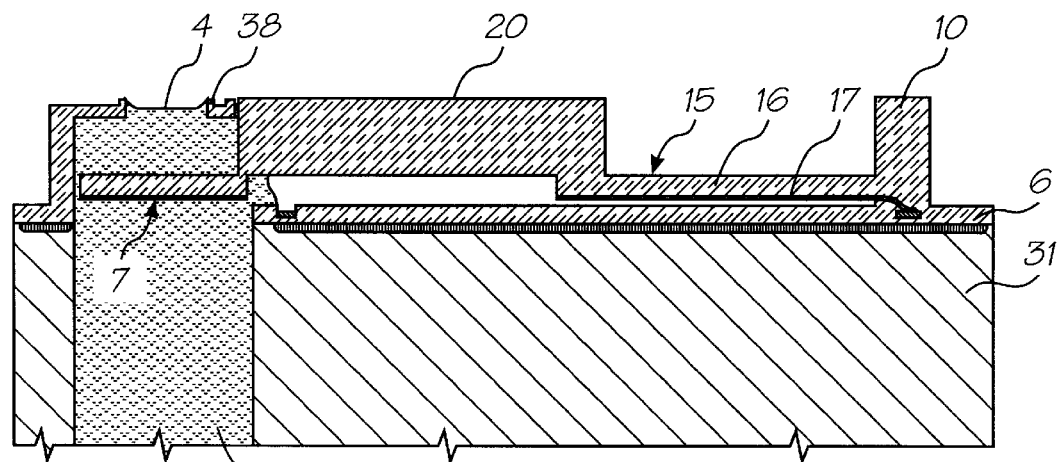

One form of detailed manufacturing process which can be used to fabricate monolithic ink jet print heads operating in accordance with the principles taught by the present embodiment can proceed utilizing the following steps:

1. Using a double sided polished wafer 31, complete a 0.5 micron, one poly, 2 metal CMOS process to form layer 6. This step is shown in FIG. 7. For clarity, these diagrams may not be to scale, and may not represent a cross section though any single plane of the nozzle. FIG. 6 is a key to representations of various materials in these manufacturing diagrams, and those of other cross referenced ink jet configurations.
2. Etch oxide layer 6 down to silicon or aluminum 32 using Mask 1. This mask defines the nozzle chamber, the surface anti-wicking notch, and the heater contacts. This step is shown in FIG. 8.
3. Deposit 1 micron of sacrificial material 33 (e.g. aluminum or photosensitive polyimide)
4. Etch (if aluminum) or develop (if photosensitive polyimide) the sacrificial layer 33 using Mask 2. This mask defines the nozzle chamber walls and the actuator anchor point. This step is shown in FIG. 9.
5. Deposit 0.2 micron of heater material 34, e.g. TiN.
6. Deposit 3.4 microns of PECVD glass 35.
7. Etch both glass 35 and heater 34 layers together, using Mask 3. This mask defines the actuator, paddle, and nozzle chamber walls. This step is shown in FIG. 10.
8. Wafer probe. All electrical connections are complete at this point, bond pads are accessible, and the chips are not yet separated.
9. Deposit 10 microns of sacrificial material 36.
10. Etch or develop sacrificial material 36 using Mask 4. This mask defines the nozzle chamber wall. This step is shown in FIG. 11.
11. Deposit 3 microns of PECVD glass 37.
12. Etch to a depth of (approx.) 1 micron using Mask 5. This mask defines the nozzle rim 38. This step is shown in FIG. 12.
13. Etch down to the sacrificial layer 36 using Mask 6. This mask defines the roof of the nozzle chamber, and the nozzle 4 itself. This step is shown in FIG. 13.
14. Back-etch completely through the silicon wafer (with, for example, an ASE Advanced Silicon Etcher from Surface Technology Systems) using Mask 7. This mask defines the ink inlets 3 which are etched through the wafer. The wafer is also diced by this etch. This step is shown in FIG. 14.
15. Etch the sacrificial material 33, 36. The nozzle chambers are cleared, the actuators freed, and the chips are separated by this etch. This step is shown in FIG. 15.
16. Mount the print heads in their packaging, which may be a molded plastic former incorporating ink channels which supply the appropriate color ink to the ink inlets 3 at the back of the wafer.
17. Connect the print heads to their interconnect systems. For a low profile connection with minimum disruption of airflow, TAB may be used. Wire bonding may also be used if the printer is to be operated with sufficient clearance to the paper.
18. Hydrophobize the front surface of the print heads.
19. Fill the completed print heads with ink 39 and test them. A filled nozzle is shown in FIG. 16.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

Ink Jet Technologies The embodiments of the invention use an ink jet printer type device. Of course many different devices could be used. However presently popular ink jet printing technologies are unlikely to be suitable.

The most significant problem with thermal inkjet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal inkjet applications. This leads to an efficiency of around 0.02%, from electricity input to drop momentum (and increased surface area) out.

The most significant problem with piezoelectric inkjet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the inkjet technologies used meet the stringent requirements of in-camera digital color printing and other high quality, high speed, low cost printing applications. To meet the requirements of digital photography, new inkjet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the inkjet systems described below with differing levels of difficulty. Forty-five different inkjet technologies have been developed by the Assignee to give a wide range of choices for high volume manufacture. These technologies form part of separate applications assigned to the present Assignee as set out in the list under the heading "Cross-References to Related Applications".

The inljet designs shown here are suitable for a wide range of digital printing systems, from battery powered one-time use digital cameras, through to desktop and network printers, and through to commercial printing systems For ease of manufacture using standard process equipment, the print head is designed to be a monolithic 0.5 micron CMOS chip with MEMS post processing. For color photographic applications, the print head is 100 mm long, with a width which depends upon the inkjet type. The smallest print head designed is U.S. patent application Ser. No. 09/112,764, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

The present invention is useful in the field of digital printing, in particular, ink jet printing. A number of patent applications in this field were filed simultaneously and incorporated by cross reference.

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. Forty-five such inkjet types were filed simultaneously to the present application.

Other ink jet configurations can readily be derived from these forty-five examples by substituting alternative configurations along one or more of the 11 axes. Most of the forty-five examples can be made into ink jet print heads with characteristics superior to any currently available ink jet technology.

Where there are prior art examples known to the inventor, one or more of these examples are listed in the examples column of the tables below. The simultaneously filed patent applications by the present applicant are listed by USSN numbers. In some cases, a print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

ACTUATOR MECHANISM (APPLIED ONLY TO SELECTED INK DROPS)

| | Description | Advantages | Disadvantages | Examples |
|---|---|---|---|---|
| Thermal bubble | An electrothermal heater heats the ink to above boiling point, | ◆ Large force generated<br>◆ Simple construction | ◆ High power<br>◆ Ink carrier limited to water | ◆ Canon Bubblejet 1979 Endo et al GB |

-continued

ACTUATOR MECHANISM (APPLIED ONLY TO SELECTED INK DROPS)

| | Description | Advantages | Disadvantages | Examples |
|---|---|---|---|---|
| | transferring significant heat to the aqueous ink. A bubble nucleates and quickly forms, expelling the ink. The efficiency of the process is low, with typically less than 0.05% of the electrical energy being transformed into kinetic energy of the drop. | ◆ No moving parts<br>◆ Fast operation<br>◆ Small chip area required for actuator | ◆ Low efficiency<br>◆ High temperatures required<br>◆ High mechanical stress<br>◆ Unusual materials required<br>◆ Large drice trasistors<br>◆ Cavitation causes actuator failure<br>◆ Kogation reduces bubble formation<br>◆ Large print heads are difficult to fabricate | patent 2,007,162<br>◆ Xerox heater-in-pit 1990 Hawkins et al U.S. Pat. No. 4,899,181<br>◆ Hewlett-Packard TIJ 1982 Vaught et al U.S. Pat. No. 4,490,728 |
| Piezoelectric | A piezoelectric crystal such as lead lanthanum zirconate (PZT) is electrically activated, and either expands, shears, or bends to apply pressure to the ink, ejecting drops. | ◆ Low power consumption<br>◆ Many ink types can be used<br>◆ Fast operation<br>◆ High efficiency | ◆ Very large area required for actuator<br>◆ Difficult to integrate with electronics<br>◆ High voltage drive transistors required<br>◆ Full pagewidth print heads impractical due to actuator size<br>◆ Requires electrical poling in high field strengths during manufacture | ◆ Kyser et al U.S. Pat. No. 3,946,398<br>◆ Zoltan U.S. Pat. No. 3,683,212<br>◆ 1973 Stemme U.S. Pat. No. 3,747,120<br>◆ Epson Stylus<br>◆ Tektronix<br>◆ USSN 09/112,803 |
| Electro-strictive | An electric field is used to activate electrostriction in relaxor materials such as lead lanthanum zirconate titanate (PLZT) or lead magnesium niobate (PMN). | ◆ Low power consumption<br>◆ Many ink types can be used<br>◆ Low thermal expansion<br>◆ Electric field strength required (approx. 3.5 V/$\mu$m) can be generated without difficulty<br>◆ Does not require electrical poling | ◆ Low maximum strain (approx. 0.01%)<br>◆ Large area required for actuator due to low strain<br>◆ Response speed is marginal (~10 $\mu$s)<br>◆ High voltage drive transistors required<br>◆ Full pagewidth print heads impractical due to actuator size | ◆ Seiko Epson, Usui et al. JP 253401/96<br>◆ USSN 09/112,803 |
| Ferroelectric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | ◆ Low power consumption<br>◆ Many ink types can be used<br>◆ Fast operation (<1 $\mu$s)<br>◆ Relatively high longitudinal strain<br>◆ High efficiency<br>◆ Electric field strength of around 3 V/$\mu$m can be readily provided | ◆ Difficult to integrate with electronics<br>◆ Unusual materials such as PLZSnT are required<br>◆ Actuators require a large area | ◆ USSN 09/112,803 |
| Electrostatic plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | ◆ Low power consumption<br>◆ Many ink types can be used<br>◆ Fast operation | ◆ Difficult to operate electrostatic devices in an aqueous environment<br>◆ The electrostatic actuator will normally need to be separated from the ink<br>◆ Very large area required to achieve high forces<br>◆ High voltage drive transistors may be required<br>◆ Full pagewidth print heads are not competitive due to actuator size | ◆ USSN 09/112,787;<br>09/112,803 |
| Electrostatic pull on ink | A strong electric field is applied to the ink, whereupon electrostatic attraction accelerates the ink towards the print medium. | ◆ Low current consumption<br>◆ Low temperature | ◆ High voltage required<br>◆ May be damaged by sparks due to air breakdown<br>◆ Required field strength increases as the drop size decreases<br>◆ High voltage drive transistors required<br>◆ Electrostatic field attracts dust | ◆ 1989 Saito et al, U.S. Pat. No. 4,799,068<br>◆ 1989 Miura et al, U.S. Pat. No. 4,810,954<br>◆ Tonejet |
| Permanent magnet electro-magnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | ◆ Low power consumption<br>◆ Many ink types can be used<br>◆ Fast operation<br>◆ High efficiency<br>◆ Easy extension from single nozzles to pagewidth print heads | ◆ Complex fabrication<br>◆ Permanent magnetic material such as Neodymium Iron Boron (NdFeB) required.<br>◆ High local currents required<br>◆ Copper metalization should be used for long electromigration lifetime and low resistivity<br>◆ Pigmented inks are usually infeasible<br>◆ Operating temperature limited to the Curie temperature (around 540 K.) | ◆ USSN 09/113,084;<br>09/112,779 |
| Soft magnetic core electro-magnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the tow parts | ◆ Low power consumption<br>◆ Many ink types can be used<br>◆ Fast operation<br>◆ High efficiency<br>◆ Easy extension from single nozzles to pagewidth print heads | ◆ Complex fabrication<br>◆ Materials not usually present in a CMOS fab such as NiFe, CoNiFe, or CoFe are required<br>◆ Copper metalization should be used for long electromigration lifetime and low resistivity<br>◆ Electroplating is required | USSN 09/112,751;<br>09/113,097;<br>09/113,066;<br>09/112,779;<br>09/113,061;<br>09/112,816;<br>09/112,772;<br>09/112,815 |

-continued

ACTUATOR MECHANISM (APPLIED ONLY TO SELECTED INK DROPS)

| | Description | Advantages | Disadvantages | Examples |
|---|---|---|---|---|
| | attract, displacing the ink. | | ◆ High saturation flux density is required (2.0–2.1 T is achievable with CoNiFe [1]) | |
| Lorenz force | The Lorenz force acting on a current carrying wire in a magnetic field is utilized. This allows the magnetic field to be supplied externally to the print head, for example with rare earth permanent magnets. Only the current carrying wire need be fabricated on the print-head, simplifying materials requirements. | ◆ Low power consumption<br>◆ Many ink types can be used<br>◆ Fast operation<br>◆ High efficiency<br>◆ Easy extension from single nozzles to pagewidth print heads | ◆ Force acts as a twisting motion<br>◆ Typically, only a quarter of the solenoid length provides force in a useful direction<br>◆ High local currents required<br>◆ Copper metalization should be used for long electromigration lifetime and low resistivity<br>◆ Pigmented inks are usually infeasible | USSN 09/113,099;<br>09/113,077;<br>09/112,818;<br>09/112,819 |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | ◆0 Many ink types can be used<br>◆ Fast operation<br>◆ Easy extension from single nozzles to pagewidth print heads<br>◆ High force is available | ◆ Force acts as a twisting motion<br>◆ Unusual materials such as Terfenol-D are required<br>◆ High local currents required<br>◆ Copper metalization should be used for long electromigration lifetime and low resistivity | ◆ Fischenbeck, U.S. Pat. No.<br>◆ USSN 09/113,121 |
| Surface tension reduction | Ink under positive pressure is held in a nozzle by surface tension. The surface tension of the ink is reduced below the bubble threshold, causing the ink to egress from the nozzle. | ◆ Low power consumption<br>◆ Simple construction<br>◆ No unusual materials required in fabrication<br>◆ High efficiency<br>nozzles to pagewidth print heads | ◆ Requires supplementary force to effect drop separation<br>◆ Requires special ink surfactants<br>◆ Speed may be limited by surfactant properties | ◆ Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | ◆ Simple construction<br>◆ No unusual materials required in fabrication<br>◆ Easy extension from single nozzles to pagewidth print heads | ◆ Requires supplementary force to effect drop separation<br>◆ Requires special ink viscosity properties<br>◆ High speed is difficult ot achieve<br>◆ Requires oscillating ink pressure<br>◆ A high temperature difference (typically 80 degrees) is required | ◆ Silverbrook, EP 0771 658 A2 and related patent applications |
| Acoustic | An acoustic wave is generated and focussed upon the drop ejection region. | ◆ Can operate without a nozzle plate | ◆ Complex drive circuitry<br>◆ Complex fabrication<br>◆ Low efficiency<br>◆ Poor control of drop position<br>◆ Poor control of drop volume | ◆ 1993 Hadimioglu et al, EUP 550,192<br>◆ 1993 Elrod et al, EUP 572,220 |
| Thermo-elastic bend actuator | An actuator which relies upon differential thermal expansion upon Joule heating is used. | ◆ Low power consumption<br>◆ Many ink types can be used<br>◆ Simple planar fabrication<br>◆ Small chip area required for each actuator<br>◆ Fast operation<br>◆ High efficiency<br>◆ CMOS compatible voltages and currents<br>◆ Standard MEMS processes can be used<br>◆ Easy extension from single nozzles to pagewidth print heads | ◆ Efficient aqueous operation requires a thermal insulator on the hot side<br>◆ Corrosion prevention can be difficult<br>◆ Pigmented inks may be infeasible, as pigment particles may jam the bend actuator | ◆ USSN 09/112,802;<br>09/112,778;<br>09/112,815;<br>09/113,096;<br>09/113,068;<br>09/113,095;<br>09/112,808;<br>09/112,809;<br>09/112,780;<br>09/113,083;<br>09/112,793;<br>09/112,794;<br>09/113,128;<br>09/113,127;<br>09/112,756;<br>09/112,755;<br>09/112,754;<br>09/112,811;<br>09/112,812;<br>09/112,813;<br>09/112,814;<br>09/112,764;<br>09/112,765;<br>09/112,767;<br>09/112,768 |
| High CTE thermoelastic actuator | A material with a very high coefficient of thermal expansion (CTE such as polytetrafluoroethylene (PTFE) is used. As high CTE material are usually non-conductive, a heater fabricated from a conductive material is incorporated. A 50 $\mu$m | ◆ High force can be generated<br>◆ Three methods of PTFE deposition are under development: chemical vapor deposition (CVD), spin coating, and evaporation<br>◆ PTFE is a candidate for low | ◆ Requires special material (e.g. PTFE)<br>◆ Requires a PTFE deposition process, which is not yet standard in ULSI fabs<br>◆ PTFE deposition cannot be followed with high temperature (above 350° C.) processing<br>◆ Pigmented inks may be infeasible, as pigment particles may jam the bend | ◆ USSN 09/112,778;<br>09/112,815;<br>09/113,096;<br>09/113,095;<br>09/112,808;<br>09/112,809;<br>09/112,780; |

-continued

ACTUATOR MECHANISM (APPLIED ONLY TO SELECTED INK DROPS)

| | Description | Advantages | Disadvantages | Examples |
|---|---|---|---|---|
| | long PTFE bend actuator with polysilicon heater and 15 mW power input can provide 180 µN force and 10 µm deflection. Actuator motions include:<br>Bend<br>Push<br>Buckle<br>Rotate | dielectric constant insulation in ULSI<br>♦ Very low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Easy extension from single nozzles to pagewidth print heads | actuator | 09/113,083;<br>09/112,793;<br>09/112,794;<br>09/113,128;<br>09/113,127;<br>09/112,756;<br>09/112,807;<br>09/112,806;<br>09/112,820 |
| Conductive polymer thermoelatic actuator | A polymer with a high coefficient of thermal expansion (such as PTFE) is doped with conducting substances to increase its conductivity it about 3 orders of magnitude below that of copper. The conducting polymer expands when resistively heated. Examples of conducting dopants include:<br>Carbon nanotubes<br>Metal fibers<br>Conductive polymers such as doped polythiophene<br>Carbon granules | ♦ High force can be generated<br>♦ Very low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents<br>♦ Easy extension from single nozzles to pagewidth print heads | ♦ Requires special materials development (High CTE conductive polymer)<br>♦ Requires a PTFE deposition process, which is not yet standard in ULSI fabs<br>♦ PTFE deposition cannot be followed with high temperature (above 350° C.) processing<br>♦ Evaporation and CVD deposition techniques cannot be used<br>♦ Pigmented inks may be infeasible, as pigment particles may jam the bend actuator | ♦ USSN 09/113,083 |
| Shape memory alloy | A shape memory alloy such as TiNi (also know as Nitinol - Nickel Titanium alloy developed at the Naval Ordnance Laboratory) is thermally switched between its weak martensitic state and its high stiffness austenic state. The shape of the actuator in its martensitic state is deformed relative to the austenic shape. The shape change causes ejection of a drop. | ♦ High force is available (stresses of hundreds of MPa)<br>♦ Large strain is available (more than 3%)<br>♦ High corrosion resistance<br>♦ Simple construction<br>♦ Easy extension from sing nozzles to pagewidth print heads<br>♦ Low voltage operation | ♦ Fatigue limits maximum number of cycles<br>♦ Low strain (1%) is required to extend fatigue resistance<br>♦ Cycle rate limited by heat removal<br>♦ Requires unusual materials (TiNi)<br>♦ The latent heat of transformation must be provided<br>♦ High current operation<br>♦ Requires pre-stressing to distort the martensitic state | ♦ USSN 09/113,122 |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | ♦ Linear Magnetic actuators can be contructed with high thrust, long travel, and high efficiency using planar semiconductor fabrication techniques<br>♦ Long actuator travel is available<br>♦ Medium force is available<br>♦ Low voltage operation | ♦ Requires unusual semiconductor materials such as soft magnetic alloys (e.g. CoNiFe)<br>♦ Some varieties also require permanent magnetic materials such as Neodymium iron boron (NdFeB)<br>♦ Requires complex multi-phase drive circuitry<br>♦ High current operation | ♦ USSN 09/113,061 |

BASIC OPERATION MODE

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | ♦ Simple operation<br>♦ No external fields required<br>♦ Satellite drops can be avoided if drop velocity is less than 4 m/s<br>♦ Can be efficient, depending upon the actuator used | ♦ Drop repetition rate is usually limited to around 10 kHz. However, this is not fundamental to the method, but is related to the refill method normally used<br>♦ All of the drop kinetic energy must be provided by the actuator<br>♦ Satellite drops usually form if drop velocity is greater than 4.5 m/s | ♦ Thermal ink jet<br>♦ Piezoelectric ink jet<br>♦ USSN 09/112,751;<br>09/112,787; 09/112,802;<br>09/112,803; 09/113,097;<br>09/113,099; 09/113,084;<br>09/112,778; 09/113,077;<br>09/113,061; 09/112,816;<br>09/112,819; 09/113,095;<br>09/112,809; 09/112,780;<br>09/113,083; 09/113,121;<br>09/113,122; 09/112,793;<br>09/112,794; 09/113,128;<br>09/113,127; 09/112,756;<br>09/112,755; 09/112,754; |

BASIC OPERATION MODE -continued

| | Description | Advantages | Disadvantages | Examples |
|---|---|---|---|---|
| | | | | 09/112,811; 09/112,812; 09/112,813; 09/112,814; 09/112,764; 09/112,765; 09/112,767; 09/112,768; 09/112,807; 09/112,806; 09/112,820 |
| Proximity | The drops to be printed are selected by some manner (e.g. thermally induced surface tension reduction of pressurized ink). Selected drops are separated from the ink in the nozzle by contact with the print medium or a transfer roller. | ◆ Very simple print head fabrication can be used<br>◆ The drop selection means does not need to provide the energy required to separate the drop from the nozzle | ◆ Requires close proximity between the print head and the print media or transfer roller<br>◆ May require two print heads printing alternate rows of the image<br>◆ Monolithic color print heads are difficult | ◆ Silverbrook, EP 0771 658 A2 and related patent applications |
| Electrostatic pull on ink | The drops to be printed are selected by some manner (e.g. thermally induced surface tension reduction of pressurized ink). Selected drops are separated from the ink in the nozzle by a strong electric field. | ◆ Very simple print head fabrication can be used<br>◆ The drop selection means does not need to provide the energy required to separate the drop from the nozzle | ◆ Requires very high electrostatic field<br>◆ Electrostatic field for small nozzle sizes is above air breakdown<br>◆ Electrostatic field may attract dust | ◆ Silverbrook, EP 0771 658 A2 and related patent applications<br>◆ Tone-Jet |
| Magnetic pull on ink | The drops to be printed are selected by some manner (e.g. thermally induced surface tension reduction of pressurized ink). Selected drops are separated from the ink in the nozzle by a strong magnetic field acting on the magnetic ink. | ◆ Very simple print head fabrication can be used<br>◆ The drop selection means does not need to provide the energy required to separate the drop from the nozzle | ◆ Requires magnetic ink<br>◆ Ink colors other than black are difficult<br>◆ Requires very high magnetic fields | ◆ Silverbrook, EP 0771 658 A2 and related patent applications |
| Shutter | The actuator moves a shutter to block ink flow to the nozzle. The ink pressure is pulsed at a multiple of the drop ejection frequency. | ◆ High speed (>50 kHz) operation can be achieved due to reduced refill time<br>◆ Drop timing can be very accurate<br>◆ The actuator energy can be very low | ◆ Moving parts are required<br>◆ Requires ink pressure modulator<br>◆ Friction and wear must be considered<br>◆ Stiction is possible | ◆ USSN 09/112,818 09/112,815; 09/112,808 |
| Shuttered grill | The actuator moves a shutter to block ink flow through a grill to the nozzle. The shutter movement need only be equal to the width of the grill holes. | ◆ Actuators with small travel can be used<br>◆ Actuators with small force can be used<br>◆ High speed (>50 kHz) operation can be achieved | ◆ Moving parts are required<br>◆ Requires ink pressure modulator<br>◆ Friction and wear must be considered<br>◆ Stiction is possible | ◆ USSN 09/113,066; 09/112,772; 09/113,096; 09/113,068 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | ◆ Extremely low energy operation is possible<br>◆ No heat dissipation problems | ◆ Requires an external pulsed magnetic field<br>◆ Requires special materials for both the actuator and the ink pusher<br>◆ Complex construction | ◆ USSN 09/112,779 |

AUXILIARY MECHANISM (APPLIED TO ALL NOZZLES)

| | Description | Advantages | Disadvantages | Examples |
|---|---|---|---|---|
| None | The actuator directly fires the ink drop, and there is no external field or other mechanism required. | ◆ Simplicity of construction<br>◆ Simplicity of operation<br>◆ Small physical size | ◆ Drop ejection energy must be supplied by individual nozzle actuator | ◆ Most ink jets, including piezoelectric and thermal bubble.<br>◆ USSN 09/112,751; 09/112,787; 09/112,802; 09/112,803; 09/113,097; 09/113,084; 09/113,078; 09/113,077; 09/113,061; 09/112,816; 09/113,095; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; |

-continued

AUXILIARY MECHANISM (APPLIED TO ALL NOZZLES)

| | Description | Advantages | Disadvantages | Examples |
|---|---|---|---|---|
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by vibrating the print head, or preferably by an actuator in the ink supply. | ♦ Oscillating ink pressure can provide a refill pulse, allowing higher operating speed<br>♦ The actuators may operate with much lower energy<br>♦ Acoustic lenses can be used to focus the sound on the nozzles | ♦ Requires external ink pressure oscillator<br>♦ Ink pressure phase and amplitude must be carefully controlled<br>♦ Acoustic reflections in the ink chamber must be designed for | 09/112,807; 09/112,806; 09/112,820<br>♦ Silverbrook, EP 0771 658 A2 and related patent applications<br>♦ USSN 09/113,066; 09/112,818; 09/112,772; 09/112,815; 09/113,096; 09/113,068; 09/112,808 |
| Media proximity | The print head is placed in close proximity to the print medium. Selected drops protrude from the print head further than unselected drops, and contact the print medium. The drop soaks into the medium fast enough to cause drop separation. | ♦ Low power<br>♦ High accuracy<br>♦ Simple print head construction | ♦ Precision assembly required<br>♦ Paper fibers may cause problems<br>♦ Cannot print on rough substrates | ♦ Silverbrook, EP 0771 658 A2 and related patent applications |
| Transfer roller | Drops are printed to a transfer roller instead of straight to the print medium A transfer roller can also be used for proximity drop separation. | ♦ High accuracy<br>♦ Wide range of print substrates can be used<br>♦ Ink can be dried on the transfer roller | ♦ Bulky<br>♦ Expensive<br>♦ Complex construction | ♦ Silverbrook, EP 0771 658 A2 and related patent applications<br>♦ Tektronix hot melt piezoelectric ink jet<br>♦ Any of USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |
| Electrostatic | An electric field is used to accelerate selected drops towards the print medium. | ♦ Low power<br>♦ Simple print head construction | ♦ Field strength required for separation of small drops is near or above air breakdown | ♦ Silverbrook, EP 0771 658 A2 and related patent applications<br>♦ Tone-Jet |
| Direct magnetic field | A magnetic field is used to accelerate selected drops of magnetic ink towards the print medium. | ♦ Low power<br>♦ Simple print head construction | ♦ Requires magnetic ink<br>♦ Requires strong magnetic field | ♦ Silverbrook, EP 0771 658 A2 and related patent applications |
| Cross magnetic field | The print head is placed in a constant magnetic field. The Lorenz force in a current carrying wire is used to move the actuator. | ♦ Does not require magnetic materials to be integrated in the print head manufacturing process | ♦ Requires external magnet<br>♦ Current densities may be high, resulting in electromigration problems | ♦ USSN 09/113,099; 09/112,819 |
| Pulsed magnetic field | A pulsed magnetic field is used to cyclically attract a paddle, which pushes on the ink. A small actuator moves a catch, which selectively prevents the paddle from moving. | ♦ Very low power operation is possible<br>♦ Small print head size | ♦ Complex print head construction<br>♦ Magnetic materials required in print head | ♦ USSN 09/112,779 |

ACTUATOR AMPLIFICATION OR MODIFICATION METHOD

| | Description | Advantages | Disadvantages | Examples |
|---|---|---|---|---|
| None | No actuator mechanical amplification is used. The actuator | ♦ Operational simplicity | ♦ Many actuator mechanisms have insufficient travel, or insufficient force, | ♦ Thermal Bubble Ink jet |

-continued

ACTUATOR AMPLIFICATION OR MODIFICATION METHOD

| | Description | Advantages | Disadvantages | Examples |
|---|---|---|---|---|
| | directly drives the drop ejection process. | | to efficiently drive the drop ejection process | ◆ USSN 09/112,751; 09/112,787; 09/113,099; 09/113,084; 09/112,819; 09/113,121; 09/113,122 |
| Differential expansion bend actuator | An actuator material expands more on one side than on the other. The expansion may be thermal, piezoelectric, magnetostrictive, or other mechanism. The bend actuator converts a high force low travel actuator mechanism to high travel, lower force mechanism. | ◆ Provides greater travel in a reduced print head area | ◆ High stresses are involved<br>◆ Care must be taken that the materials do not delaminate<br>◆ Residual bend resulting from high temperature or high stress during formation 09/113,083; 09/112,793; | ◆ Piezoelectric<br>◆ USSN 09/112,802; 09/112,778; 09/112,815; 09/113,096; 09/113,068; 09/113,095; 09/112,808; 09/112,809; 09/112,780; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820 |
| Transient bend actuator | A trilayer bend actuator where the two outside layers are identical. This cancels bend due to ambient temperature and residual stress. The actuator only responds to transient heating of one side or the other. | ◆ Very good temperature stability<br>◆ High speed, as a new drop can be fired before heat dissipates<br>◆ Cancels residual stress of formation | ◆ High stresses are involved<br>◆ Care must be taken that the materials do not delaminate | ◆ USSN 09/112,767; 09/112,768 |
| Reverse spring | The actuator loads a spring. When the actuator is turned off, the spring releases. This can reverse the force/distance curve of the actuator to make it compatible with the force/time requirements of the drop ejection. | ◆ Better coupling to the ink | ◆ Fabrication complexity<br>◆ High stress in the spring | ◆ USSN 09/113,097; 09/113,077 |
| Actuator stack | A series of thin actuators are stacked. This can be appropriate where actuators require high electric field strength, such as electrostatic and piezoelectric actuators. | ◆ Increased travel<br>◆ Reduced drive voltage | ◆ Increased fabrication complexity<br>◆ Increased possibility of short circuits due to pinholes | ◆ Some piezoelectric ink jets<br>◆ USSN 09/112,803 |
| Multiple actuators | Multiple smaller actuators are used simultaneously to move the ink. Each actuator need provide only a portion of the force required. | ◆ Increases the force available from an actuator<br>◆ Multiple actuators can be positioned to control ink flow accurately | ◆ Actuator forces may not add linearly, reducing efficiency | ◆ USSN 09/113,061; 09/112,818; 09/113,096; 09/113,095; 09/112,809; 09/112,794; 09/112,807; 09/112,806 |
| Linear Spring | A linear spring is used to transform a motion with small travel and high force into a longer travel, lower force motion. | ◆ Matches low travel actuator with higher travel requirements<br>◆ Non-contact method of motion transformation | ◆ Requires print head area for the spring | ◆ USSN 09/112,772 |
| Coiled actuator | A bend actuator is coiled to provide greater travel in a reduced chip area. | ◆ Increases travel<br>◆ Reduces chip area<br>◆ Planar implementations are relatively easy to fabricate. | ◆ Generally restricted to planar implementations due to extreme fabrication difficulty in other orientations. | ◆ USSN 09/112,815; 09/112,808; 09/112,811; 09/112,812 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | ◆ Simple means of increasing travel of a bend actuator | ◆ Care must be taken not to exceed the elastic limit in the flexure area<br>◆ Stress distribution is very uneven<br>◆ Difficult to accurately model with finite element analysis | ◆ USSN 09/112,779; 09/113,068; 09/112,754 |
| Catch | The actuator controls a small catch. The catch either enables or disables movement of an ink pusher that is controlled in a bulk manner. | ◆ Very low actuator energy<br>◆ Very small actuator size | ◆ Complex construction<br>◆ Requires external force<br>◆ Unsuitable for pigmented inks | ◆ USSN 09/112,779 |
| Gears | Gears can be used to increase travel at the expense of duration. Circular gears, rack and pinion, ratchets, and other gearing methods can be used. | ◆ Low force, low travel actuators can be used<br>◆ Can be fabricated using standard surface MEMS processes | ◆ Moving parts are required<br>◆ Several actuator cycles are required<br>◆ More complex drive electronics<br>◆ Complex construction<br>◆ Friction, friction, and wear are possible | ◆ USSN 09/112,818 |
| Buckle plate | A buckle plate can be used to change a slow actuator into a fast motion. It can also convert a high force, low travel actuator into a high travel, medium force motion. | ◆ Very fast movement achievable | ◆ Must stay within elastic limits of the materials for long device life<br>◆ High stresses involved<br>◆ Generally high power requirement | ◆ S. Hirata et al, "An Ink-jet Head Using Diaphragm Micro-actuator", Proc. IEEE MEMS, Feb. 1996, |

-continued

ACTUATOR AMPLIFICATION OR MODIFICATION METHOD

| | Description | Advantages | Disadvantages | Examples |
|---|---|---|---|---|
| | | | | pp 418–423.<br>◆ USSN 09/113,096; 09/112,793 |
| Tapered magnetic pole | A tapered magnetic pole can increase travel at the expense of force. | ◆ Linearizes the magnetic force/distance curve | ◆ Complex construction | ◆ USSN 09/112,816 |
| Lever | A lever and fulcrum is used to transform a motion with small travel and high force into a motion with longer travel and lower force. The lever can also reverse the direction of travel. | ◆ Matches low travel actuator with higher travel requirements<br>◆ Fulcrum area has no linear movement, and can be used for a fluid seal | ◆ High stress around the fulcrum | ◆ USSN 09/112,755; 09/112,813; 09/112,814 |
| Rotary impeller | The actuator is connected to a rotary impeller. A small angular deflection of the actuator results in a rotation of the impeller vanes, which push the ink against stationary vanes and out of the nozzle. | ◆ High mechanical advantage<br>◆ The ratio of force to travel of the actuator can be matched to the nozzle requirements by varying the number of impeller vanes | ◆ Complex construction<br>◆ Unsuitable for pigmented inks | ◆ USSN 09/112,794 |
| Acoustic lens | A refractive or diffractive (e.g. zone plate) acoustic lens is used to concentrate sound waves. | ◆ No moving parts | ◆ Large area required<br>◆ Only relevant for acoustic ink jets | ◆ 1993 Hadimioglu et al, EUP 550,192<br>◆ 1993 Elrod et al, EUP 572,220 |
| Sharp conductive point | A sharp point is used to concentrate an electrostatic field. | ◆ Simple construction | ◆ Difficult to fabricate using standard VLSI processes for a surface ejecting ink-jet<br>◆ Only relevant for electrostatic ink jets | ◆ Tone-jet |

ACTUATOR MOTION

| | Description | Advantages | Disadvantages | Examples |
|---|---|---|---|---|
| Volume expansion | The volume of the actuator changes, pushing the ink in all directions. | ◆ Simple construction in the case of thermal ink jet | ◆ High energy is typically required to achieve volume expansion. This leads to thermal stress, cavitation, and kogation in thermal ink jet implementations | ◆ Hewlett-Packard Thermal Ink jet<br>◆ Canon Bubblejet |
| Linear, normal to chip surface | The actuator moves in a direction normal to the print head surface. The nozzle is typically in the line of movement. | ◆ Efficient coupling to ink drops ejected normal to the surface | ◆ High fabrication complexity may be required to achieve perpendicular motion | ◆ USSN 09/112,751; 09/112,787; 09/112,803; 09/113,084; 09/113,077; 09/112,816 |
| Parallel to chip surface | The actuator moves parallel to the print head surface. Drop ejection may still be normal to the surface. | ◆ Suitable for planar fabrication | ◆ Fabrication complexity<br>◆ Friction<br>◆ Stiction | ◆ USSN 09/113,061; 09/112,818; 09/112,772; 09/112,754; 09/112,811; 09/112,812; 09/112,813 |
| Membrane push | An actuator with a high force but small area is used to push a stiff membrane that is in contact with the ink. | ◆ The effective area of the actuator becomes the membrane area | ◆ Fabrication complexity<br>◆ Actuator size<br>◆ Difficulty of integration in a VLSI process | ◆ 1982 Howkins U.S. Pat. No. 4,459,601 |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ USSN 09/113,097; 09/113,066; 09/112,818; 09/112,794 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al U.S. Pat. No. 3,946,398<br>◆ 1973 Stemme U.S. Pat. No. 3,747,120<br>◆ 09/112,802; 09/112,778; 09/112,779; 09/113,068; 09/112,780; 09/113,083; 09/113,121; 09/113,128; 09/113,127; 09/112,756; 09/112,754; 09/112,811; 09/112,812 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ USSN 09/113,099 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ USSN 09/113,122; 09/112,755 |

-continued

ACTUATOR MOTION

| | Description | Advantages | Disadvantages | Examples |
|---|---|---|---|---|
| Double bend | The actuator bends in one direction when one element is energized, and bends the other way when another element is energized. | ◆ One actuator can be used to power two nozzles.<br>◆ Reduced chip size.<br>◆ Not sensitive to ambient temperature | ◆ Difficult to make the drops ejected by both bend directions identical.<br>◆ A small efficiency loss compared to equivalent single bend actuators. | ◆ USSN 09/112,813; 09/112,814; 09/112,764 |
| Shear | Energizing the actuator causes a shear motion in the actuator material. | ◆ Can increase the effective travel of piezoelectric actuators | ◆ Not readily applicable to other actuator mechanisms | ◆ 1985 Fishbeck U.S. Pat. No. 4,584,590 |
| Radial constriction | The actuator squeezes an ink reservoir, forcing ink from a constricted nozzle. | ◆ Relatively easy to fabricate single nozzles from glass tubing as macroscopic structures | ◆ High force required<br>◆ Inefficient<br>◆ Difficult to integrate with VLSI processes | ◆ 1970 Zoltan U.S. Pat. No. 3,683,212 |
| Coil/uncoil | A coiled actuator uncoils or coils more tightly. The motion of the free end of the actuator ejects the ink. | ◆ Easy to fabricate as a planar VLSI process<br>◆ Small area required, therefore low cost | ◆ Difficult to fabricate for non-planar devices<br>◆ Poor out-of-plane stiffness | ◆ USSN 09/112,815; 09/112,808; 09/112,811; 09/112,812 |
| Bow | The actuator bows (or buckles) in the middle when energized. | ◆ Can increase the speed of travel<br>◆ Mechanically rigid | ◆ Maximum travel is constrained<br>◆ High force required | ◆ USSN 09/112,819; 09/113,096; 09/112,793 |
| Push-Pull | Two actuators control a shutter. One actuator pulls the shutter, and the other pushes it. | ◆ The structure is pinned at both ends, so has a high out-of-plane rigidity | ◆ Not readily suitable for ink jets which directly push the ink | ◆ USSN 09/113,096 |
| Curl inwards | A set of actuators curl inwards to reduce the volume of ink that they enclose. | ◆ Good fluid flow to the region behind the actuator increases efficiency | ◆ Design complexity | ◆ USSN 09/113,095; 09/112,807 |
| Curl outwards | A set of actuators curl outwards, pressurizing ink in a chamber surrounding the actuators, and expelling ink from a nozzle in the chamber. | ◆ Relatively simple construction | ◆ Relatively large chip area | ◆ USSN 09/112,806 |
| Iris | Multiple vanes enclose a volume of ink. These simultaneously rotate, reducing the volume between the vanes. | ◆ High efficiency<br>◆ Small chip area | ◆ High fabrication complexity<br>◆ Not suitable for pigmented inks | ◆ USSN 09/112,809 |
| Acoustic vibration | The actuator vibrates at a high frequency. | ◆ The actuator can be physically distant from the ink | ◆ Large area required for efficient operation at useful frequencies<br>◆ Acoustic coupling and crosstalk<br>◆ Complex drive circuitry<br>◆ Poor control of drop volume and position | ◆ 1993 Hadimioglu et al, EUP 550,192<br>◆ 1993 Elrod et al, EUP 572,220 |
| None | In various ink jet designs the actuator does not move. | ◆ No moving parts | ◆ Various other tradeoffs are required to eliminate moving parts | ◆ Silverbrook, EP 0771 658 A2 and related patent applications<br>◆ Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle | ◆ Fabrication simplicity<br>◆ Operational simplicity | ◆ Low speed<br>◆ Surface tension force relatively small compared to actuator force<br>◆ Long refill time usually dominates the total repetition rate | ◆ Thermal ink jet<br>◆ Piezoelectric ink jet<br>◆ USSN-09/112,751; 09/113,084; 09/112,779; 09/112,816; 09/112,819; 09/113,095; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |
| Shuttered oscillating ink pressure | Ink to the nozzle chamber is provided at a pressure that oscillates at twice the drop ejection frequency. | ◆ High speed<br>◆ Low actuator energy, as the actuator need only open or | ◆ Requires common ink pressure oscillator<br>◆ May not be suitable for pigmented | ◆ USSN 09/113,066; 09/112,818; 09/112,772; 09/112,815; 09/113,096; |

NOZZLE REFILL METHOD

|  | Description | Advantages | Disadvantages | Examples |
|---|---|---|---|---|
|  | When a drop is to be ejected, the shutter is opened for 3 half cycles: drop ejection, actuator return, and refill. The shutter is then closed to prevent the nozzle chamber emptying during the next negative pressure cycle. | close the shutter, instead of ejecting the ink drop | inks | 09/113,068; 09/112,808 |
| Refill actuator | After the main actuator has ejected a drop a second (refill) actuator is energized. The refill actuator pushes ink into the nozzle chamber. The refill actuator returns slowly, to prevent its return from emptying the chamber again. | ♦ High speed, as the nozzle is actively refilled | ♦ Requires two independent actuators per nozzle | ♦ USSN 09/112,778 |
| Positive ink pressure | The ink is held a slight positive pressure. After the ink drop is ejected, the nozzle chamber fills quickly as surface tension and ink pressure both operate to refill the nozzle. | ♦ High refill rate, therefore a high drop repetition rate is possible | ♦ Surface spill must be prevented<br>♦ Highly hydrophobic print head surfaces are required | ♦ Silverbrook, EP 0771 658 A2 and related patent applications<br>♦ Alternative for: USSN 09/112,751; 09/112,787; 09/112,802; 09/112,803; 09/113,097; 09/113,099; 09/113,084; 09/112,799; 09/113,077; 09/113,061; 09/112,818; 09/112,816; 09/112,819; 09/113,095; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |

METHOD OF RESTRICTING BACK-FLOW THROUGH INLET

|  | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | ♦ Design simplicity<br>♦ Operational simplicity<br>♦ Reduces crosstalk | ♦ Restricts refill rate<br>♦ May result in a relatively large chip area<br>♦ Only partially effective | ♦ Thermal ink jet<br>♦ Piezoelectric ink jet<br>♦ USSN 09/112,807; 09/112,806 |
| Positive ink pressure | The ink is under a positive pressure, so that in the quiescent state some of the ink drop already protrudes from the nozzle.<br>This reduces the pressure in the nozzle chamber which is required to eject a certain volume of ink. The reduction in chamber pressure results in a reduction in ink pushed out through the inlet. | ♦ Drop selection and separation forces can be reduced<br>♦ Fast refill time | ♦ Requires a method (such as a nozzle rim or effective hydrophobizing, or both) to prevent flooding of the ejection surface of the print head. | ♦ Silverbrook, EP 0771 658 A2 and related patent applications<br>♦ Possible operation of the following:<br>♦ USSN 09/112,751; 09/112,787; 09/112,802; 09/112,803; 09/113,097; 09/113,099; 09/113,084; 09/112,778; 09/112,779; 09/113,077; 09/113,061; 09/112,816; 09/112,819; 09/113,095; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,813; 09/112,814; 09/112,764; 09/112,765; 09/112,767; 09/112,768; |
| Baffle | One or more baffles are placed in the inlet ink flow. When the actuator is | ♦ The refill rate is not as restricted as the long inlet | ♦ Design complexity<br>♦ May increase fabrication complexity | ♦ HP Thermal Ink Jet<br>♦ Tektronix |

-continued

METHOD OF RESTRICTING BACK-FLOW THROUGH INLET

| | Description | Advantages | Disadvantages | Examples |
|---|---|---|---|---|
| | energized, the rapid ink movement creates eddies which restrict the flow through the inlet. The slower refill process is unrestricted, and does not result in eddies. | method.<br>♦ Reduces crosstalk | (e.g. Tektronix hot melt Piezoelectric print heads). | piezoelectric ink jet |
| Flexible flap restricts inlet | In this method recently disclosed by Canon, the expanding actuator (bubble) pushes on a flexible flap that restricts the inlet. | ♦ Significantly reduces back-flow for edge-shooter thermal ink jet devices | ♦ Not applicable to most ink jet configurations<br>♦ Increased fabrication complexity<br>♦ Inelastic deformation of polymer flap results in creep over extended use | ♦ Canon |
| Inlet filter | A filter is located between the ink inlet and the nozzle chamber. The filter has a multitude of small holes or slots, restricting ink flow. The filter also removes particles which may block the nozzle. | ♦ Additional advantage of ink filtration<br>♦ Ink filter may be fabricated with no additional process steps | ♦ Restricts refill rate<br>♦ May result in complex construction | ♦ USSN 09/112,803; 09/113,061; 09/113,083; 09/112,793; 09/113,128; 09/113,127 |
| Small inlet compared to nozzle | The ink inlet channel to the nozzle chamber has a substantially smaller cross section than that of the nozzle, resulting in easier ink egress out of the nozzle than out of the inlet. | ♦ Design simplicity | ♦ Restricts refill rate<br>♦ May result in a relatively large chip area<br>♦ Only partially effective | ♦ USSN 09/112,787; 09/112,814; 09/112,820 |
| Inlet shutter | A secondary actuator controls the position of a shutter, closing off the ink inlet when the main actuator is energized. | ♦ Increases speed of the ink-jet print head operation | ♦ Requires separate refill actuator and drive circuit | ♦ USSN 09/112,778 |
| The inlet is located behind the ink-pushing surface | The method avoids the problem of inlet back-flow by arranging the ink-pushing surface of the actuator between the inlet and the nozzle. | ♦ Back-flow problem is eliminated | ♦ Requires careful design to minimize the negative pressure behind the paddle | ♦ USSN 09/112,751; 09/112,802; 09/113,097; 09/113,099; 09/113,084; 09/112,779; 09/113,077; 09/112,816; 09/112,819; 09/112,809; 09/112,780; 09/113,121; 09/112,794; 09/112,756; 09/112,755; 09/112,754; 09/112,811; 09/112,812; 09/112,813; 09/112,765; 09/112,767; 09/112,768 |
| Part of the actuator moves to shut off the inlet | The actuator and a wall of the ink chamber are arranged so that the motion of the actuator closes off the inlet. | ♦ Significant reductions in back-flow can be achieved<br>♦ Compact designs possible | ♦ Small increase in fabrication complexity | ♦ USSN 09/113,084; 09/113,095; 09/113,122; 09/112,764 |
| Nozzle actuator does not result in ink back-flow | In some configurations of ink jet, there is no expansion or movement of an actuator which may cause ink back-flow through the inlet. | ♦ Ink back-flow problem is eliminated | ♦ None related to ink back-flow on actuation | ♦ Silverbrook, EP 0771 658 A2 and related patent applications<br>♦ Valve-jet<br>♦ Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air.<br>The nozzle firing is usually performed during a special clearing cycle, after first moving the print head to a cleaning station. | ♦ No added complexity on the print head | ♦ May not be sufficient to displace dried ink | ♦ Most ink jet systems<br>♦ USSN 09/112,751; 09/112,787; 09/112,802; 09/112,803; 09/113,097; 09/113,099; 09/113,084; 09/112,778; 09/112,779; 09/113,077; 09/113,061; 09/112,816; 09/112,819; 09/113,095; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,813; 09/112,814; 09/112,764; 09/112,765; 09/112,767; 09/112,768; |

-continued

NOZZLE CLEARING METHOD

| | Description | Advantages | Disadvantages | Examples |
|---|---|---|---|---|
| Extra power to ink heater | In systems which heat the ink, but do not boil it under normal situations, nozzle clearing can be achieved by over-powering the heater and boiling ink at the nozzle. | ◆ Can be highly effective if the heater is adjacent to the nozzle | ◆ Requires higher drive voltage for clearing<br>◆ May require larger drive transistors | 09/112,807; 09/112,806; 09/112,820; 09/112,821<br>◆ Silverbrook, EP 0771 658 A2 and related patent applications |
| Rapid succession of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | ◆ Does not require extra drive circuits on the print head<br>◆ Can be readily controlled and initiated by digital logic | ◆ Effectiveness depends substantially upon the configuration of the ink jet nozzle<br><br>09/113,099; 09/113,084; | ◆ May be used with:<br>USSN 09/112,751; 09/112,787; 09/112,802; 09/112,803; 09/113,097;<br><br>09/112,778; 09/112,779; 09/113,077; 09/112,816; 09/112,819; 09/113,095; 09/112,809; 09/112,780; 09/113,083; 09/113,121; 09/112,793; 09/112,794; 09/113,128; 09/113,127; 09/112,756; 09/112,755; 09/112,754; 09/112,811; 09/112,813; 09/112,814; 09/112,764; 09/112,765; 09/112,767; 09/112,768; 09/112,807; 09/112,806; 09/112,820; 09/112,821 |
| Extra power to ink pushing actuator | Where an actuator is not normally driven to the limit of its motion, nozzle clearing may be assisted by providing an enhanced drive signal to the actuator. | ◆ A simple solution where applicable | ◆ Not suitable where there is a hard limit to actuator movement | ◆ May be used with:<br>USSN 09/112,802; 09/112,778; 09/112,819; 09/113,095; 09/112,780; 09/113,083; 09/113,121; 09/112,793; 09/113,128; 09/113,127; 09/112,756; 09/112,755; 09/112,765; 09/112,767; 09/112,768; 09/112,807; 09/112,806; 09/112,820; 09/112,821 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | ◆ A high nozzle clearing capability can be achieved<br>◆ May be implemented at very low cost in systems which already include acoustic actuators | ◆ High implementation cost if system does not already include an acoustic actuator | ◆ USSN 09/113,066; 09/112,818; 09/112,772; 09/112,815; 09/113,096; 09/113,068; 09/112,808 |
| Nozzle clearing plate | A microfabricated plate is pushed against the nozzles. The plate has a post for every nozzle. A post moves through each nozzle, displacing dried ink | ◆ Can clear severely clogged nozzles | ◆ Accurate mechanical alignment is required<br>◆ Moving parts are required<br>◆ There is risk of damage to the nozzles<br>◆ Accurate fabrication is required | ◆ Silverbrook, EP 0771 658 A2 and related patent applications |
| Ink pressure pulse | The pressure of the ink is temporarily increased so that ink streams from all of the nozzles. This may be used in conjunction with actuator energizing. | ◆ May be effective where other methods cannot be used | ◆ Requires pressure pump or other pressure actuator<br>◆ Expensive<br>◆ Wasteful of ink | ◆ May be used with ink jets covered by USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,738; 09/112,807; 09/112,806; 09/112,820; 09/112,821 |

-continued

NOZZLE CLEARING METHOD

| | Description | Advantages | Disadvantages | Examples |
|---|---|---|---|---|
| Print head wiper | A flexible 'blade' is wiped across the print head surface. The blade is usually fabricated from a flexible polymer, e.g. rubber or synthetic elastomer. | ◆ Effective for planar print head surfaces<br>◆ Low cost | ◆ Difficult to use if print head surface is non-planar or very fragile<br>◆ Requires mechanical parts<br>◆ Blade can wear out in high volume print systems | ◆ Many ink jet systems |
| Separate ink boiling heater | A separate heater is provided at the nozzle although the normal drop ejection mechanism does not require it. The heaters do not require individual drive circuits, as many nozzles can be cleared simultaneously, and no imaging is required. | ◆ Can be effective where other nozzle clearing methods cannot be used<br>◆ Can be implemented at no additional cost in some inkjet configurations | ◆ Fabrication complexity | ◆ Can be used with many ink jets covered by USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |

NOZZLE PLATE CONSTRUCTION

| | Description | Advantages | Disadvantages | Examples |
|---|---|---|---|---|
| Electroformed nickel | A nozzle plate is separately fabricated from electroformed nickel, and bonded to the print head chip. | ◆ Fabrication simplicity | ◆ High temperatures and pressures are required to bond nozzle plate<br>◆ Minimum thickness constraints<br>◆ Differential thermal expansion | ◆ Hewlett Packard Thermal ink jet |
| Laser ablated or drilled polymer | Individual nozzle holes are ablated by an intense UV laser in a nozzle plate, which is typically a polymer such as polyimide or polysulphone | ◆ No masks required<br>◆ Can be quite fast<br>◆ Some control over nozzle profile is possible<br>◆ Equipment required is relatively low cost | ◆ Each hole must be individually formed<br>◆ Special equipment required<br>◆ Slow where there are many thousands of nozzles per print head<br>◆ May produce thin burrs at exit holes | ◆ Canon Bubblejet<br>◆ 1988 Sercel et al., SPIE, Vol. 998 Excimer Beam Applications, pp. 76–83<br>◆ 1993 Watanabe et al., U.S. Pat. No. 5,208,604 |
| Silicon micromachined | A separate nozzle plate is micromachined from single crystal silicon, and bonded to the print head wafer. | ◆ High accuracy is attainable | ◆ Two part construction<br>◆ High cost<br>◆ Requires precision alignment<br>◆ Nozzles may be clogged by adhesive | ◆ K. Bean, IEEE Transactions on Electron Devices, Vol. ED-25, No. 10, 1978, pp 1185–1195<br>◆ Xerox 1990 Hawkins et al., U.S. Pat. No. 4,899,181 |
| Glass capillaries | Fine glass capillaries are drawn from glass tubing. This method has been used for making individual nozzles, but is difficult to use for bulk manufacturing of print heads with thousands of nozzles. | ◆ No expensive equipment required<br>◆ Simple to make single nozzles | ◆ Very small nozzle sizes are difficult to form<br>◆ Not suited for mass production | ◆ 1970 Zoltan U.S. Pat. No. 3,683,212 |
| Monolithic, surface micromachined using VLSI lithographic processes | The nozzle plate is deposited as a layer using standard VLSI deposition techniques. Nozzles are etched in the nozzle plate using VLSI lithography and etching. | ◆ High accuracy (<1 $\mu$m)<br>◆ Monolithic<br>◆ Low cost<br>◆ Existing processes can be used | ◆ Requires sacrificial layer under the nozzle plate to form the nozzle chamber<br>◆ Surface may be fragile to the touch | ◆ Silverbrook, EP 0771 658 A2 and related patent applications<br>◆ ussn 09/112,751; 09/112,787; 09/112,803; 09/113,077; 09/113,061; 09/112,815; 09/113,096; 09/113,095; 09/112,809; 09/113,083; 09/112,793; |

-continued

NOZZLE PLATE CONSTRUCTION

| | Description | Advantages | Disadvantages | Examples |
|---|---|---|---|---|
| | | | | 09/112,794; 09/113,128; 09/113,127; 09/112,756; 09/112,755; 09/112,754; 09/112,811; 09/112,813; 09/112,814; 09/112,764; 09/112,765; 09/112,767; 09/112,768; 09/112,807; 09/112,806; 09/112,820 |
| Monolithic, etched through substrate | The nozzle plate is a buried etch stop in the wafer. Nozzle chambers are etched in the front of the wafer, and the wafer is thinned from the back side. Nozzles are then etched in the etch stop layer. | ◆ High accuracy (<1 $\mu$m)<br>◆ Monolithic<br>◆ Low cost<br>◆ No differential expansion | ◆ Requires long etch times<br>◆ Requires a support wafer<br><br>09/112,818; 09/112,816; | ◆ ussn 09/112,802; 09/113,097; 09/113,099; 09/113,084; 09/113,066; 09/112,778; 09/112,779; 09/112,772; 09/112,819; 09/113,068; 09/112,808; 09/112,780; 09/113,121; 09/113,122 |
| No nozzle plate | Various methods have been tried to eliminate the nozzles entirely, to prevent nozzle clogging. These include thermal bubble mechanisms and acoustic lens mechanisms | ◆ No nozzles to become clogged | ◆ Difficult to control drop position accurately<br>◆ Crosstalk problems | ◆ Ricoh 1995 Sekiya et al U.S. Pat. No. 5,412,413<br>◆ 1993 Hadimioglu et al EUP 550,192<br>◆ 1993 Elrod et al EUP 572,220 |
| Trough | Each drop ejector has a trough through which a paddle moves. There is no nozzle plate. | ◆ Reduced manufacturing complexity<br>◆ Monolithic | ◆ Drop firing direction is sensitive to wicking. | ◆ USSN 09/112,812 |
| Nozzle slit instead of individual nozzles | The elimination of nozzle holes and replacement by a slit encompassing many actuator positions reduces nozzle clogging, but increases crosstalk due to ink surface waves | ◆ No nozzles to become clogged | ◆ Difficult to control drop position. accurately<br>◆ Crosstalk problems | ◆ 1989 Saito et al U.S. Pat. No. 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | ◆ Simple construction<br>◆ No silicon etching required<br>◆ Good heat sinking via substrate<br>◆ Mechanically strong<br>◆ Ease of chip handing | ◆ Nozzles limited to edge<br>◆ High resolution is difficult<br>◆ Fast color printing requires one print head per color | ◆ Canon Bubblejet 1979 Endo et al GB patent 2,007,162<br>◆ Xerox heater-in-pit 1990 Hawkins et al U.S. Pat. No. 4,899,181<br>◆ Tonejet |
| Surface ('roof shooter') | Ink flow is along the surface of the chip, and ink drops are ejected from the chip surface, normal to the plane of the chip. | ◆ No bulk silicon etching required<br>◆ Silicon can make an effective heat sink<br>◆ Mechanical strength | ◆ Maximum ink flow is severely restricted | ◆ Hewlett-Packard TIJ 1982 Vaught et al U.S. Pat. No. 4,490,728<br>◆ USSN 09/112,787, 09/113,077; 09/113,061; 09/113,095; 09/112,809 |
| Through chip, forward ('up shooter') | Ink flow is through the chip, and ink drops are ejected from the front surface of the chip. | ◆ High ink flow<br>◆ Suitable for pagewidth print heads<br>◆ High nozzle packing density therefore low manufacturing cost | | ◆ Silverbrook, EP 0771 658 A2 and related patent applications<br>◆ USSN 09/112,803; 09/112,815; 09/113,096; 09/113,093; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |
| Through chip, reverse ('down shooter') | Ink flow is through the chip, and ink drops are ejected from the rear surface of the chip. | ◆ High ink flow<br>◆ Suitable for pagewidth print heads<br>◆ High nozzle packing density therefore low | ◆ Requires wafer thinning<br>◆ Requires special handling during manufacture | ◆ USSN 09/112,751; 09/112,802; 09/113,097; 09/113,099; 09/113,084; 09/113,066; 09/112,778; 09/112,779; 09/112,818; |

-continued

DROP EJECTION DIRECTION

| | Description | Advantages | Disadvantages | Examples |
|---|---|---|---|---|
| | | manufacturing cost | | 09/112,816; 09/112,772; 09/112,819; 09/113,068; 09/112,808; 09/112,780; 09/113,121; 09/113,122 |
| Through actuator | Ink flow is through the actuator, which is not fabricated as part of the same substrate as the drive transistors. | ♦ Suitable for piezoelectric print heads | ♦ Pagewidth print heads require several thousand connections to drive circuits<br>♦ Cannot be manufactured in standard CMOS fabs<br>♦ Complex assembly required | ♦ Epson Stylus<br>♦ Tektronix hot melt piezoelectric ink jets |

INK TYPE

| | Description | Advantages | Disadvantages | Examples |
|---|---|---|---|---|
| Aqueous, dye | Water based ink which typically contains: water, dye, surfactant, humectant, and biocide. Modern ink dyes have high water-fastness, light fastness | ♦ Environmentally friendly<br>♦ No odor | ♦ Slow drying<br>♦ Corrosive<br>♦ Bleeds on paper<br>♦ May strikethrough<br>♦ Cockles paper | ♦ Most existing ink jets<br>♦ USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821<br>♦ Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | ♦ Environmentally friendly<br>♦ No odor<br>♦ Reduced bleed<br>♦ Reduced wicking<br>♦ Reduced strikethrough | ♦ Slow drying<br>♦ Corrosive<br>♦ Pigment may clog nozzles<br>♦ Pigment may clog actuator mechanisms<br>♦ Cockles paper | ♦ USSN 09/112,787; 09/112,803; 09/113,068; 09/113,122; 09/112,793; 09/113,127<br>♦ Silverbrook, EP 0771 658 A2 and related patent applications<br>♦ Piezoelectric ink-jets<br>♦ Thermal ink jets (with significant restrictions) |
| Methyl Ethyl Ketone (MEK) | MEK is a highly volatile solvent used for industrial printing on difficult surfaces such as aluminum cans. | ♦ Very fast drying<br>♦ Prints on various substrates such as metals and plastics | ♦ Odorous<br>♦ Flammable | ♦ USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; |

-continued

INK TYPE

| | Description | Advantages | Disadvantages | Examples |
|---|---|---|---|---|
| Alcohol (ethanol, 2-butanol, and others) | Alcohol based inks can be used where the printer must operate at temperatures below the freezing point of water. An example of this is in-camera consumer photographic printing. | ◆ Fast drying<br>◆ Operates at sub-freezing temperatures<br>◆ Reduced paper cockle<br>◆ Low cost | ◆ Slight odor<br>◆ Flammable | 09/112,811; 09/112,812; 09/112,813; 09/112,814; 09/112,764; 09/112,765; 09/112,767; 09/112,768; 09/112,807; 09/112,806; 09/112,820; 09/112,821<br>◆ USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | ◆ No drying time- ink instantly freezes on the print medium<br>◆ Almost any print medium can be used<br>◆ No paper cockle occurs<br>◆ No wicking occurs<br>◆ No bleed occurs<br>◆ No strikethrough occurs | ◆ High viscosity<br>◆ Printed ink typically has a 'waxy' feel<br>◆ Printed pages may 'block'<br>◆ Ink temperature may be above the curie point of permanent magnets<br>◆ Ink heaters consume power<br>◆ Long warm-up time | ◆ Tektronix hot melt piezoelectric ink jets<br>◆ 1989 Nowak U.S. Pat. No. 4,820,346<br>◆ USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |
| Oil | Oil based inks are extensively used in offset printing. They have advantages in improved characteristics on paper (especially no wicking or cockle). Oil soluble dies and pigments are required. | ◆ High solubility medium for some dyes<br>◆ Does not cockle paper<br>◆ Does not wick through paper | ◆ High viscosity: this is a significant limitation for use in inkjets, which usually require a low viscosity. Some short chain and multi-branched oils have a sufficiently low viscosity.<br>◆ Slow drying | ◆ USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; |

-continued

INK TYPE

| | Description | Advantages | Disadvantages | Examples |
|---|---|---|---|---|
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed<br>◆ High dye solubility<br>◆ Water, oil, and amphiphilic soluble dies can be used<br>◆ Can stabilize pigment suspensions | ◆ Viscosity higher than water<br>◆ Cost is slightly higher than water based ink<br>◆ High surfactant concentration required (around 5%) | 09/112,764; 09/112,765; 09/112,767; 09/112,768; 09/112,807; 09/112,806; 09/112,820; 09/112,821<br>◆ USSN 09/112,751; 09/112,787; 09/112,802; 09/112,803; 09/113,097; 09/113,099; 09/113,084; 09/113,066; 09/112,778; 09/112,779; 09/113,077; 09/113,061; 09/112,818; 09/112,816; 09/112,772; 09/112,819; 09/112,815; 09/113,096; 09/113,068; 09/113,095; 09/112,808; 09/112,809; 09/112,780; 09/113,083; 09/113,121; 09/113,122; 09/112,793; 09/112,794; 09/113,128; 09/113,127; 09/112,756; 09/112,755; 09/112,754; 09/112,811; 09/112,812; 09/112,813; 09/112,814; 09/112,764; 09/112,765; 09/112,767; 09/112,768; 09/112,807; 09/112,806; 09/112,820; 09/112,821 |

We claim:

1. A method of manufacture of an ink jet printhead which includes:

providing a substrate;

depositing a doped layer on the substrate and etching said layer to create an array of nozzles on the substrate with a nozzle chamber in communication with each nozzle; and utilizing planar monolithic deposition, lithographic and etching processes to create a paddle arranged in each nozzle chamber, each paddle being connected to a thermal bend actuator unit and the thermal bend actuator unit comprising a plurality of thermal bend devices arranged in spaced, parallel relationship.

2. A method of manufacturing an ink jet printhead as claimed in claim 1 wherein multiple ink jet printheads are formed simultaneously on the substrate.

3. A method of manufacturing an ink jet printhead as claimed in claim 1 wherein said substrate is a silicon wafer.

4. A method of manufacturing an ink jet printhead as claimed in claim 1 wherein integrated drive electronics are formed on the same substrate.

5. A method of manufacturing an ink jet printhead as claimed in claim 4 wherein said integrated drive electronics are formed using a CMOS fabrication process.

6. A method of manufacturing an ink jet printhead as claimed in claim 1 wherein ink is ejected from said substrate normal to said substrate.

7. A method of manufacture of an ink jet printhead arrangement including a series of nozzle chambers, said method comprising the steps of:

(a) utilising an initial semiconductor wafer having an electrical circuitry layer formed thereon;

(b) etching said electrical circuitry layer so as to define a nozzle chamber area;

(c) depositing and etching a first sacrificial layer, said etching defining a series of nozzle chamber walls and an actuator anchor point;

(d) depositing a first heater material layer;

(e) depositing an intermediate material layer;

(f) etching said first heater material layer and said intermediate material layer to define portions of an actuator, ejection paddle and nozzle chamber walls;

(g) depositing and etching a second sacrificial layer, said etching including etching a cavity defining a portion of the nozzle chamber walls;

(h) depositing and etching a further glass layer to define the roof of the nozzle chamber and the walls thereof;

(i) etching an ink supply channel through said wafer to form a fluid communication with said nozzle chamber; and (j) etching away remaining sacrificial material.

8. A method as claimed in claim 7 wherein said intermediate layer comprises substantially glass.

9. A method as claimed in claim 7 wherein said first heater material layer comprises substantially Titanium Nitride.

10. A method as claimed in claim 7 wherein said steps further include the step of etching anti-wicking notches in the surface of said circuitry layer.

11. A method as claimed in claim 7 further including the step of depositing corrosion barriers over portions of said arrangement so as to reduce corrosion effects.

12. A method as claimed in claim 7 wherein the etching of layers includes etching vias so as to allow for the electrical interconnection of portions of subsequent layers.

13. A method as claimed in claim 7 wherein said wafer comprises a double side polished CMOS wafer.

14. A method as claimed in claim 7 wherein said step (j) comprises a through wafer etch from a back surface of said wafer.

15. A method as claimed in claim 7 wherein step (j) is also utilized to simultaneously separate said wafer into separate printheads.

* * * * *